United States Patent
Kaplan et al.

(10) Patent No.: US 10,567,883 B2
(45) Date of Patent: Feb. 18, 2020

(54) PIEZO-ELECTRIC ACTUATORS

(71) Applicant: AUDIO PIXELS LTD., Rehovot (IL)

(72) Inventors: Shay Kaplan, Givat Elah (IL); Yuval Cohen, Rehovot (IL); Daniel Lewin, Ramat Hasharon (IL); Meir Ben Simon, Givat Ela (IL); Eric Andreas Haber, Kibbutz Kfar Menahem (IL)

(73) Assignee: AUDIO PIXELS LTD., Rehovot (IL)

( * ) Notice: Subject to any disclaimer, the term of this patent is extended or adjusted under 35 U.S.C. 154(b) by 0 days.

(21) Appl. No.: 15/880,064

(22) Filed: Jan. 25, 2018

(65) Prior Publication Data

US 2018/0234773 A1    Aug. 16, 2018

Related U.S. Application Data

(63) Continuation-in-part of application No. 15/746,499, filed as application No. PCT/IL2016/050805 on Jul. 21, 2016, now Pat. No. 10,433,067.
(Continued)

(51) Int. Cl.
*H04R 17/00* (2006.01)
*H01L 27/20* (2006.01)
(Continued)

(52) U.S. Cl.
CPC ........... *H04R 17/00* (2013.01); *B81B 3/0021* (2013.01); *B81C 1/00182* (2013.01);
(Continued)

(58) Field of Classification Search
CPC . H01L 41/09; H01L 41/0906; H01L 41/0913; H01L 41/092; H01L 41/0926; H01L 41/0933; H01L 41/094; H01L 41/0946; H01L 41/0953; H01L 41/096; H01L 41/0966; H01L 41/1876; H01L 41/22; H01L 41/27; H01L 41/293; H01L 41/297; H04R 17/00; H04R 17/005; B81C 1/00158; B81C 1/00182; B81C 1/00216; B81B 3/0021; B81B 2203/053
(Continued)

(56) References Cited

U.S. PATENT DOCUMENTS 6,710,950 B2   3/2004   Karouvinen et al.
6,967,362 B2   11/2005  Nam et al.
(Continued)

FOREIGN PATENT DOCUMENTS

DE    3736896 A1    5/1989
GB    2467776 A     8/2010
(Continued)

*Primary Examiner* — Jesse A Elbin
(74) *Attorney, Agent, or Firm* — Browdy and Neimark, PLLC

(57) ABSTRACT

There is provided a piezo-electric actuator comprising an assembly comprising a first electrode, a second electrode, and at least one piezoelectric layer located between said first electrode and said second electrode, wherein at least one of the first electrode and the second electrode is split into at least two different sub-electrodes, wherein at least part of the assembly is configured to move along an axis perpendicular to a surface of the assembly, in response to an electrical stimulus applied to at least one of said first and second electrodes.

9 Claims, 21 Drawing Sheets

Related U.S. Application Data

(60) Provisional application No. 62/195,392, filed on Jul. 22, 2015, provisional application No. 62/317,713, filed on Apr. 4, 2016.

(51) Int. Cl.
| | | |
|---|---|---|
| *H01L 41/047* | (2006.01) | |
| *H01L 41/083* | (2006.01) | |
| *H01L 41/297* | (2013.01) | |
| *H01L 41/293* | (2013.01) | |
| *H01L 41/273* | (2013.01) | |
| *H01L 41/09* | (2006.01) | |
| *B81C 1/00* | (2006.01) | |
| *B81B 3/00* | (2006.01) | |
| *H01L 41/187* | (2006.01) | |
| *H04R 31/00* | (2006.01) | |
| *H04R 7/06* | (2006.01) | |

(52) U.S. Cl.
CPC .......... *H01L 27/20* (2013.01); *H01L 41/0471* (2013.01); *H01L 41/0472* (2013.01); *H01L 41/0475* (2013.01); *H01L 41/0835* (2013.01); *H01L 41/0973* (2013.01); *H01L 41/273* (2013.01); *H01L 41/293* (2013.01); *H01L 41/297* (2013.01); *B81B 2203/053* (2013.01); *B81C 1/00158* (2013.01); *H01L 41/187* (2013.01); *H01L 41/1876* (2013.01); *H04R 7/06* (2013.01); *H04R 31/003* (2013.01); *H04R 2201/003* (2013.01)

(58) Field of Classification Search
USPC .......... 257/416, 419; 381/162, 190, 424, 431
See application file for complete search history.

(56) References Cited

U.S. PATENT DOCUMENTS

| | | |
|---|---|---|
| 7,075,212 B2 | 7/2006 | Witteveen |
| 8,085,964 B2 | 12/2011 | Cohen et al. |
| 8,280,079 B2 | 10/2012 | Chung et al. |
| 8,401,220 B2 | 3/2013 | Kim et al. |
| 8,780,673 B2 | 7/2014 | Cohen et al. |
| 9,683,612 B2* | 6/2017 | Klassen .................. F16D 11/14 |
| 10,149,054 B2* | 12/2018 | Casset ..................... B06B 1/02 |
| 2004/0061543 A1 | 4/2004 | Nam et al. |
| 2005/0057120 A1 | 3/2005 | Nanataki et al. |
| 2005/0082946 A1 | 4/2005 | Takeuchi et al. |
| 2007/0019280 A1 | 1/2007 | Sasagawa et al. |
| 2010/0013574 A1 | 1/2010 | Huang |
| 2011/0080927 A1 | 4/2011 | Morikawa et al. |
| 2011/0169408 A1 | 7/2011 | Chen et al. |
| 2012/0076330 A1 | 3/2012 | Cohen et al. |
| 2012/0087522 A1 | 4/2012 | Lee et al. |
| 2014/0056449 A1* | 2/2014 | Noro ..................... H04R 17/00 381/190 |
| 2015/0071467 A1 | 3/2015 | Kaplan et al. |
| 2015/0215706 A1 | 7/2015 | Sparks et al. |
| 2018/0098139 A1* | 4/2018 | Arevalo Carreno ... H04R 31/00 |

FOREIGN PATENT DOCUMENTS

| | | |
|---|---|---|
| WO | 2007/135678 A2 | 11/2007 |
| WO | 2009/066290 A2 | 5/2009 |
| WO | 2010038229 A2 | 4/2010 |
| WO | 2011/033028 A1 | 3/2011 |
| WO | 2011/111042 A1 | 9/2011 |
| WO | 2012/070042 A1 | 5/2012 |
| WO | 2013/082169 A1 | 6/2013 |

\* cited by examiner

PIEZO-ELECTRIC ACTUATORS

TECHNOLOGICAL FIELD

The presently disclosed subject matter relates to piezo-electric elements in general, and specifically to sound pressure producing elements which comprise piezoelectric elements and which can be used in Digital Sound Reconstruction (DSR) speakers.

BACKGROUND

DSR speakers can use different types of actuation, such as electromagnetic actuation, electrostatic actuation, or piezo-electric actuation.

For example, DSR speakers are disclosed in U.S. Pat. Nos. 8,085,964, 8,780,673 and U.S. Patent Publication Number 2015/0071467, to the same Applicant.

Piezoelectric actuators are also known in the art, such as PI Ceramics GMBH PL022.30 or PL112-PL140.

Acknowledgement of the above references and device herein is not to be inferred as meaning that these are in any way relevant to the patentability of the presently disclosed subject matter.

DSR speakers are speakers that generally use an array of small moving elements, as opposed to a single large membrane, to create audible sound. Each one of these small moving elements is capable of producing sound pressure wave pulses. An original sound waveform can be reconstructed by DSR speakers when the number of pulses-per-clock correlates to the sound pressure wave that one wants to produce and when the pulse clock frequency is higher than the human ear's capability of distinguishing the single pulses.

There is a need in the art for new DSR speakers and new methods of manufacturing said DSR speakers.

SUMMARY OF THE INVENTION

In accordance with certain aspects of the presently disclosed subject matter, there is provided a piezo-electric actuator comprising an assembly comprising a first electrode, a second electrode, and at least one piezoelectric layer located between said first electrode and said second electrode, wherein at least one of the first electrode and the second electrode is split into at least two different sub-electrodes, and wherein at least part of the assembly is configured to move upwards or downwards, in response to an electrical stimulus applied to at least one of said first and second electrodes.

According to some embodiments, both the first electrode and the second electrode are split into at least two different sub-electrodes.

According to some embodiments, a cross-section of the assembly has at least one straight side.

According to some embodiments, the piezo-electric actuator further comprises a base, said assembly being secured to said base along at least part of one side of said assembly.

According to some embodiments, the assembly is configured to bend along an axis perpendicular to a surface of the assembly.

According to some embodiments, when a sub-electrode of the first electrode is connected to a positive potential, and another sub-electrode of the first electrode is connected to a negative potential, corresponding opposite sub-electrodes of the second electrode are connected to opposite potentials with respect to the sub-electrodes of the first electrode.

According to some embodiments, the first electrode is connected to a first conductive element, the second electrode is connected to a second conductive element, wherein the first conductive element is not in alignment with the second conductive element.

According to some embodiments, for at least one of the first and the second electrodes, the two sub-electrodes are connected to an electrical supply, wherein the two sub-electrodes comprise a first sub-electrode and a second sub-electrode, wherein the second sub-electrode is located farther from the electrical supply than the first sub-electrode, wherein the piezo-electric actuator comprises a conductive layer connecting the electrical supply to the second sub-electrode.

According to some embodiments, the conductive layer is insulated from the first sub-electrode by an insulating layer.

According to some embodiments, the conductive layer is electrically connected to the second sub-electrode through a via hole present in the insulating layer.

According to some embodiments, for at least one of the first and the second electrodes, the two sub-electrodes are connected to an electrical supply, wherein the two sub-electrodes comprise a first sub-electrode and a second sub-electrode, wherein the second sub-electrode is located farther from the electrical supply than the first electrode, wherein the piezo-electric actuator comprises a metal trace adjacent to the first sub-electrode connecting the electrical supply to the second sub-electrode.

According to some embodiments, the piezo-electric actuator comprises a third electrode layer, a first piezoelectric layer located between said first electrode and said third electrode, and a second piezoelectric layer located between said third electrode and said second electrode.

According to some embodiments, said first and second electrodes include conductive elements for at least one of the connection between different electrodes, the connection with another piezo-electric actuator, and the connection with an external electrical supply.

According to some embodiments, there is provided an array of piezo-electric actuators comprising a plurality of piezo-electric actuators.

In accordance with some aspects of the presently disclosed subject matter, there is provided a method of controlling a piezo-electric actuator comprising an assembly comprising a first electrode a second electrode, and at least one piezoelectric layer located between said first electrode and said second electrode, wherein the first electrode is split into at least two different sub-electrodes, the method comprising feeding a sub-electrode of the first electrode with a positive electrical potential, and another sub-electrode of the first electrode with a negative electrical potential, in order to make the assembly bend upwards or downwards.

According to some embodiments, the assembly comprises a third electrode layer, a first piezoelectric layer located between said first electrode and said third electrode, and a second piezoelectric layer located between said third electrode and said second electrode.

According to some embodiments, the second electrode is split into two sub-electrodes, the method comprising feeding a sub-electrode of the first electrode with a positive electrical potential, and another sub-electrode of the first electrode with a negative electrical potential, and feeding corresponding opposite sub-electrodes of the second electrode with opposite electrical potentials with respect to the sub-electrodes of the first electrode.

According to some embodiments, for at least one of the first and the second electrodes, the two sub-electrodes are connected to an electrical supply, wherein the two sub-electrodes comprise a first sub-electrode and a second sub-electrode, wherein the second sub-electrode is located farther from the electrical supply than the first electrode, the method comprising feeding an electrical potential from the electrical supply to the second sub-electrode through a metal trace adjacent to the first sub-electrode.

According to some embodiments, for at least one of the first and the second electrodes, the two sub-electrodes are connected to an electrical supply, wherein the two sub-electrodes comprise a first sub-electrode and a second sub-electrode, wherein the second sub-electrode is located farther from the electrical supply than the first electrode, the method comprising feeding an electrical potential from the electrical supply to the second sub-electrode through a conductive layer.

According to some embodiments, the conductive layer is electrically insulated from the first sub-electrode by an insulating layer.

In accordance with some aspects of the presently disclosed subject matter, there is provided a DSR speaker element comprising at least a central moving element; a plurality of peripheral flexure benders, each flexure bender comprising at least a pair of electrodes and at least a piezoelectric material layer, the flexure benders being connected to said moving element and being configured to move said moving element along an axis perpendicular to a moving element surface, in response to an electrical stimulus applied to said electrodes, in order to produce sound, and at least a mechanical stopper which is configured to limit the motion of said moving element.

According to some embodiments, the DSR speaker element comprises a substrate comprising a cavity, said substrate also serving as said mechanical stopper. According to some embodiments, the mechanical stopper is located on one side of the moving element, wherein the DSR speaker element further comprises an additional mechanical stopper located on the other side of the moving element. According to some embodiments, each flexure bender comprises a first electrode layer comprising a first electrode, a first piezoelectric material layer on at least said first electrode layer, a second electrode layer on said first piezoelectric material layer, said second electrode layer comprising a second electrode, and a second piezoelectric material layer on at least said second electrode layer. According to some embodiments, each flexure bender further comprises a third electrode layer on said second piezoelectric material layer, said third electrode layer comprising a third electrode. According to some embodiments, the moving element comprises piezoelectric material and/or silicon or other material. According to some embodiments, at least part of any of said electrodes is split into at least two different sub-electrodes. According to some embodiments, a conductive layer and an insulating layer are disposed on top of the sacrificial layer and below the first electrode layer. According to some embodiments, a conductive layer and an insulating layer are disposed on top of the top electrode layer. According to some embodiments, at least part of the piezoelectric material layer is located between said pair of electrodes. According to some embodiments, the moving element and said piezoelectric material layer in each flexure bender are made by the deposition of a common piezoelectric material layer and the subsequent forming of gaps in said common piezoelectric material layer. According to some embodiments, said gaps are formed subsequently by the removal of fins made from a material which can be selectively removed, or the etching of the material in the gaps. According to some embodiments, for each flexure bender, a first electrode of said pair of electrodes is connected to a first conductive element, the first electrode and the first conductive element belonging to a first electrode layer, a second electrode of said pair of electrodes is connected to a second conductive element, the second electrode and the second conductive element belonging to a second electrode layer, and the first conductive element of the first electrode layer is not in alignment with the second conductive element of the second electrode layer.

In accordance with some aspects of the presently disclosed subject matter, there is provided a DSR speaker comprising an array of DSR speaker elements.

In accordance with some aspects of the presently disclosed subject matter, there is provided a method of forming a DSR speaker element, the method comprising providing a substrate base; disposing a sacrificial layer on at least part of said substrate base; disposing a first electrode layer on at least part of said sacrificial layer; disposing a first piezoelectric material layer on said first electrode layer and on at least part of the sacrificial layer, disposing a second electrode layer on least part of said first piezoelectric material layer, wherein at least part of the first and the second electrode layers are in alignment, forming gaps in the first piezoelectric material layer, to define at least one peripheral flexure bender comprising a portion of said first electrode layer, a portion of said first piezoelectric material layer and a portion of said second electrode layer, and a central moving element comprising another portion of said first piezoelectric material layer, wherein said flexure bender is connected to said moving element, for moving said moving element in response to an electrical stimulus applied to said first and second electrode layers.

According to some embodiments, at least part of the first and second electrode layers are deposited so as to have a curved shape. According to some embodiments, the first and second electrode layers are disposed so as to each comprise a plurality of distinct electrode portions, the method comprising forming said gaps in the first piezoelectric material layer, to define a plurality of peripheral flexure benders each comprising an electrode portion of the first electrode layer, a portion of said first piezoelectric material layer and an electrode portion of the second electrode layer, and a central moving element comprising another portion of said first piezoelectric material layer. According to some embodiments, the method comprises disposing a second piezoelectric material layer on at least part of said second electrode layer and on at least part of the first piezoelectric layer located on the sacrificial layer, and forming gaps in the first and second piezoelectric material layers to define at least one peripheral flexure bender comprising a portion of said first electrode layer, a portion of said first piezoelectric material layer, a portion of said second electrode layer, and a portion of said second piezoelectric material layer, and a moving element comprising another portion of said first piezoelectric material layer and another portion of said second piezoelectric material layer, and disposing a third electrode layer on said second piezoelectric material layer. According to some embodiments, the method comprises removing a portion of said substrate base at a diameter smaller than the diameter of said moving element, to form a cavity, and removing part of the sacrificial layer to form a mechanical stopper that limits the movement of said moving element. According to some embodiments, the method comprises disposing a mechanical stopper on a side of said moving element which is opposite to the substrate base, to limit the motion of said moving element. According to some embodiments, the method comprises after the step of disposing a sacrificial layer on said substrate base and before the step of disposing a first electrode layer on said sacrificial layer, the step of disposing removable fins on said sacrificial layer, said removable fins comprising a material that can later be selectively removed for forming said gaps. According to some embodiments, the step of disposing a first piezoelectric material layer comprises one of the methods from the list of sputtering; sol-get deposition; pressing a fine powder of piezoelectric material; and pressing a powder of piezoelectric material mixed with a binder. According to some embodiments, said step of forming gaps through said first piezoelectric material layer comprises one of the methods selected from the list of: a dry etching process; wet etching process, chemical dissolving, and laser cutting. According to some embodiments, said first and second electrode layers include conductive elements for the connection between different electrodes of each electrode layer and for the connection with another DSR speaker element and/or with an external power source. According to some embodiments, said first and second electrode layers include conductive elements which are not in alignment. According to some embodiments, the ratio of thickness of said flexure bender to the width of at least a gap of said gaps is larger than 2.

In accordance with some aspects of the presently disclosed subject matter, there is provided an array of DSR speaker elements formed using said method of forming a DSR speaker element.

In accordance with some aspects of the presently disclosed subject matter, there is provided a method of forming a DSR speaker element, the method comprising providing a substrate base; disposing a sacrificial layer on said substrate base; disposing a first electrode layer on said sacrificial layer; disposing a first piezoelectric material layer on at least part of said first electrode layer, disposing a second electrode layer on said first piezoelectric material layer, wherein at least part of the first and the second electrode layers are in alignment, disposing a moving element layer comprising a material different from a piezoelectric material; forming gaps on each side of a section comprising a portion of the first electrode layer, a portion of the first piezoelectric material layer and a portion of the second electrode layer, to define at least one peripheral flexure bender comprising said portion of said first electrode layer, said portion of the first piezoelectric material layer and said portion of the second electrode layer, and a central moving element comprising a material different from a piezoelectric material, wherein said flexure bender is connected to said moving element, for moving said moving element in response to an electrical stimulus applied to said first and second electrode layers.

According to some embodiments, the first and second electrode layers are disposed so as to each comprise a plurality of distinct electrode portions, the method comprising forming said gaps, to define a plurality of peripheral flexure benders each comprising an electrode portion of the first electrode layer, a portion of said first piezoelectric material layer and an electrode portion of the second electrode layer, and a central moving element comprising a material different from a piezoelectric material.

According to some embodiments, the method comprises disposing a second piezoelectric material layer on at least part of said second electrode layer and on at least part of the first piezoelectric layer located on the sacrificial layer, and forming gaps on each side of a section comprising a portion of the first electrode layer, a portion of the first piezoelectric material layer, a portion of the second electrode layer, and a portion of the second piezoelectric material layer to define at least one peripheral flexure bender comprising said portion of the first electrode layer, said portion of the first piezoelectric material layer, said portion of the second electrode layer, and said portion of the second piezoelectric material layer, and a central moving element comprising a material different from a piezoelectric material, and disposing a third electrode layer on said second piezoelectric material layer.

In accordance with another aspect of the invention a method of forming a DSR speaker element is provided. The method includes the procedures of: providing a substrate base, disposing a sacrificial layer on the substrate base, disposing a first electrode layer on the sacrificial layer, and disposing a first piezoelectric material layer on the first electrode layer. The first piezoelectric material layer has a thickness in the range of 1 µm-25 µm. The method also includes the procedure of disposing a second electrode layer on the first piezoelectric material layer in alignment with the first electrode layer. The second electrode layer is shaped in the form of a flexure bender. The method also includes the procedure of disposing a second piezoelectric material layer on the second electrode layer. The second piezoelectric material layer has a thickness in the range of 1 µm-25 µm. The method also includes the procedure of disposing a third electrode layer on the second piezoelectric material layer in alignment with the first electrode layer and the second electrode layer. The third electrode layer is shaped in the form of a flexure bender. The method also includes the procedure of forming gaps through the first piezoelectric material layer and the second piezoelectric material layer to define at least one flexure bender attached to and located between a moving element and an area surrounding the moving element. The flexure bender includes the first electrode layer, the second electrode layer, and the third electrode layer. The flexure bender also includes a portion of the first piezoelectric material layer sandwiched between the first electrode layer and the second electrode layer, and a portion of the second electrode layer sandwiched between the second electrode layer and the third electrode layer, thereby forming a gapped deposited piezoelectric layer including a flexure bender section and a moving element section. The flexure bender section being connected to the moving element section and configured to bend and move the moving element along an axis perpendicular to a plane of the surrounding area in response to an electrical stimulus to the electrode layers, and wherein the piezoelectric material in the moving element and the portions of piezoelectric material in the flexure bender are made from a given piezoelectric material layer by the common deposition of the piezoelectric material layers and the subsequent forming of gaps in the piezoelectric material layers. The method also includes the procedure of removing a portion of the substrate base at a first diameter smaller than the diameter of the moving element, thereby constituting a partial substrate base, to form a cavity and gain access to the sacrificial layer element and forming a mechanical stop that limits the movement of the moving element. The method also includes the procedure of removing a portion of the sacrificial layer at a second diameter larger than the first diameter to form a space between a first side of the moving element portion and the substrate base undercutting the first piezoelectric material layer and the second piezoelectric material layer and releasing an area below the flexure bender to allow free movement of the moving element.

In accordance with certain embodiments of the method of forming a DSR speaker element the procedure of disposing a third electrode layer on the second piezoelectric material layer is done after the procedure of forming gaps through the first piezoelectric material layer and the second piezoelectric material layer.

In accordance with certain embodiments of the method of forming a DSR speaker element, the substrate base is made from one of the following materials: glass and silicon.

In accordance with certain embodiments of the method of forming a DSR speaker element the sacrificial layer is made from one of the following materials: silicon dioxide and silicon.

In accordance with certain embodiments of the method of forming a DSR speaker element the piezoelectric layer is made of PZT. In accordance with other embodiments of the method of forming a DSR speaker element the piezoelectric layer is made of ZnO.

In accordance with certain embodiments of the method of forming a DSR speaker element after the procedure of disposing a sacrificial layer on the substrate base and before the procedure of disposing a first electrode layer on the sacrificial layer there is a procedure of disposing removable fins made from a material that can later be selectively removed on the sacrificial layer. The fins defining future gaps in piezoelectric material that will be added later. These gaps define the flexure benders and moving element by separating them from the rest of the layer.

In accordance with certain embodiments of the method of forming a DSR speaker element the procedure of forming gaps through the piezoelectric material layer further includes the sub-procedure of removing fins.

In accordance with certain embodiments of the method of forming a DSR speaker element the method includes the procedure of disposing a stopper on another side of the moving element to limit the motion of the moving element when the flexure benders are actuated. The actuation is done by providing electrical stimulation to the piezoelectric material layer via the electrode layers.

In accordance with certain embodiments of the method of forming a DSR speaker element, the procedure of disposing a first piezoelectric material layer, and/or the procedure of disposing a second piezoelectric material layer, comprises one of the sub-procedures selected from the list of: sputtering, sol-get deposition, pressing a fine powder of piezoelectric material, and pressing a fine powder of piezoelectric material mixed with a binder.

In accordance with certain embodiments of the method of forming a DSR speaker element the procedure of forming gaps through the piezoelectric material layer, and/or the procedure of removing a portion/section of the substrate base, and/or the procedure of removing a portion/section of the sacrificial layer, further comprises one of the sub-procedures selected from the list of: a dry etching process, a wet etching process, chemical dissolving, and laser cutting.

In accordance with certain embodiments of the method of forming a DSR speaker element, the electrode layers include conductive elements to connect one electrode to the other electrode on the same electrode layer, electrodes on one speaker element to electrodes on another speaker element or to a power source.

In accordance with certain embodiments of the method of forming a DSR speaker element, the conductive elements on the different electrode layers are configured so as to have minimum capacitance between them.

In accordance with certain embodiments of the method of forming a DSR speaker element, an array of DSR speaker elements formed using the method is provided.

In accordance with certain embodiments of the method of forming a DSR speaker element, a DSR speaker formed using arrays of DSR speaker elements formed using the method is provided.

In accordance with certain embodiments of the method of forming a DSR speaker element, the procedure of disposing a first piezoelectric material layer is followed by the procedure of sintering the first piezoelectric material layer.

In accordance with certain embodiments of the method of forming a DSR speaker element the procedure of disposing a second piezoelectric material layer is followed by the procedure of sintering the second piezoelectric material layer.

In accordance with certain embodiments of the method of forming a DSR speaker element this includes the procedure of polishing fins.

In accordance with certain embodiments of the method of forming a DSR speaker element the ratio of thickness of the flexure benders to the width of the gaps separating them from the rest of the layer is larger than 2.

In accordance with an aspect of the invention, a DSR speaker element is provided. The DSR speaker element includes: a moving element made from a piezoelectric material, and at least one flexure bender including a pair of electrodes and a portion of piezoelectric material. The flexure bender is connected to the moving element and configured to move the moving element in response to an electrical stimulus to the electrodes along an axis perpendicular to the moving element surface. The piezoelectric material in the moving element and the portion of piezoelectric material in the flexure bender are made from a given piezoelectric material layer by the common deposition of the piezoelectric material layer and the subsequent forming of gaps in the piezoelectric material layer. The piezoelectric material layer is supported on a substrate having a cavity below the moving element. The substrate also serves as a mechanical stopper that limits the movement of the moving element.

In accordance with certain embodiments the DSR speaker element includes a stopper disposed on the other side of the moving element. The stopper is configured to limit motion of the moving element.

In accordance with certain embodiments of the DSR speaker element, the flexure bender includes a second piezoelectric material layer disposed on the pair of electrodes and a third electrode disposed on the second piezoelectric material layer.

In accordance with certain embodiments of the DSR speaker element, the gaps are formed using disposing removable fins made from a material that can later be selectively removed on a sacrificial layer. The fins defining the future gaps in piezoelectric material that will be added later.

In accordance with certain embodiments of the DSR speaker element, piezoelectric material is disposed over removable fins or over material other than piezoelectric material that will later form a portion of the moving element, and said disposed piezoelectric material may be removed from said structures using polishing, chemical mechanical polishing, or other planarization techniques known in the art.

In accordance with certain embodiments of the DSR speaker element, one of the electrodes is thicker than the other one of the electrodes and resists lateral shrinking.

In accordance with certain embodiments of the DSR speaker element, an array of DSR speaker elements is provided.

In accordance with certain embodiments of the DSR speaker element, the ratio of thickness of the flexure benders to the width of the gap is larger than 2.

In accordance with an aspect of the invention a method of forming a piezoelectric element is provided. The method includes the procedures of preparing a substrate base and disposing a first electrode layer on the substrate base. The first electrode layer is smaller than the surface area of the substrate base and is sized and designated for a specific function or purpose. The method also includes the procedure of disposing a thin piezoelectric material layer on the first electrode layer. The deposited thin piezoelectric material layer is not able to sustain or support itself without the support of the substrate. The method also includes the procedure of disposing a second electrode layer on the piezoelectric material layer. The second electrode layer is smaller than the surface area of the first thin piezoelectric material layer and thicker or thinner than the first electrode layer. The method also includes the procedure of forming gaps through the piezoelectric material layer to define a first functional section including a portion of electrode layers and piezoelectric material and a second functional section composed only substantially of piezoelectric material layer.

In accordance with certain embodiments of the method of forming a piezoelectric element, after the procedure of disposing a second electrode layer on the piezoelectric material layer there is the procedure of disposing a second thin piezoelectric material layer on the second electrode layer.

In accordance with certain embodiments of the method of forming a piezoelectric element, after the procedure of disposing a second thin piezoelectric material layer on the second electrode layer there is the procedure of disposing a third electrode layer on the second piezoelectric material layer.

In accordance with certain embodiments of the method of forming a piezoelectric element, after the procedure of preparing a substrate base and before the procedure of disposing a first electrode on the substrate base there is the procedure of disposing a sacrificial layer on the substrate base.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Certain embodiments relate to a DSR speaker element (which can be also designated as a sound pressure producing element or piezoelectric DSR speaker element), comprising piezoelectric structures, and a method of forming thereof.

Figure 1A:
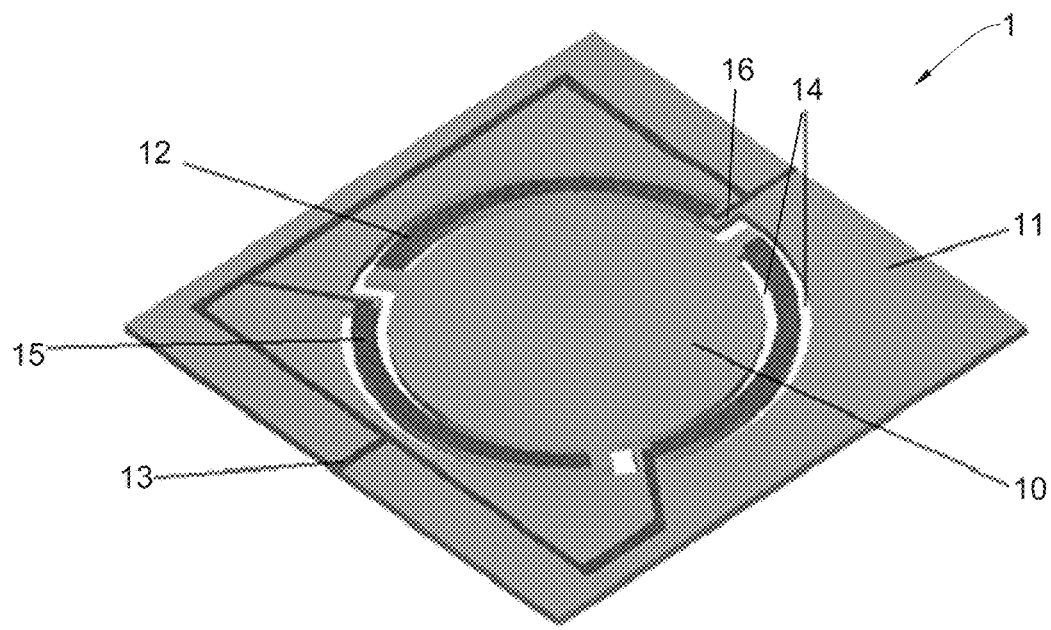
FIG. 1A is a schematic, top, perspective view of a piezoelectric actuated DSR speaker element, according to one embodiment.

FIG. 1A is a schematic top, perspective view of an embodiment of a DSR speaker element 1. A DSR speaker can typically comprise a plurality of these DSR speaker elements 1.

As shown in FIG. 1A, the DSR speaker element 1 comprises a central moving element 10. This central moving element 10 can be moved by piezoelectric actuation.

In this embodiment, the DSR speaker element 1 comprises a first functional section or portion comprising the central moving element 10, and a second distinct functional section or portion comprising a plurality of peripheral flexure benders 12. Although three peripheral flexure benders are shown in FIG. 1A, more than three peripheral flexure benders can be used.

As shown, the DSR speaker element 1 can also comprise a surrounding area 11.

According to some embodiments, the size (e.g. the diameter) of the moving element 10 is smaller than the shortest wavelength of the sound pressure pulse produced by the movement of the moving element 10.

According to some embodiments, the moving element 10 can be made as small as practically possible. Indeed, the smaller the moving element 10, the more moving elements 10 can be included in the same surface area to produce almost the same sound pressure level (SPL) with better resolution.

In certain embodiments, a DSR speaker can comprise moving elements 10 sized in the range of 50 μm-1000 μm (these values are however not limitative), which is much smaller than the shortest wavelength contained in the sound pressure pulse that is produced.

According to some embodiments, the flexure benders 12 are connected at a first end to the moving element 10 and at a second end to the area 11 surrounding the moving element 10 and the flexure benders 12. The flexure benders 12 are configured so that actuating the flexure benders 12 causes the moving element 10 to travel along an axis (substantially) perpendicular to surface 11 (and also substantially perpendicular to a moving element surface).

According to some embodiments, the moving element 10, the flexure benders 12, and the area 11 comprise piezoelectric material which originates from at least one common piezoelectric material layer.

In the present specification, the expression "piezoelectric material layer" refers to a layer which comprises at least piezoelectric material, or only piezoelectric material.

One non-limitative example of a suitable piezoelectric material is Lead Zirconate Titanate (PZT). In certain embodiments, the thickness of the whole piezoelectric material layer can be in the range of 2 μm-100 μm.

Gaps 14 in the piezoelectric material layer, on each side of the flexure benders, define the distinct functional sections 10, 11 and 12. Gaps 16 between the different flexure benders 12 define the peripheral portion of each flexure bender.

Figure 2:
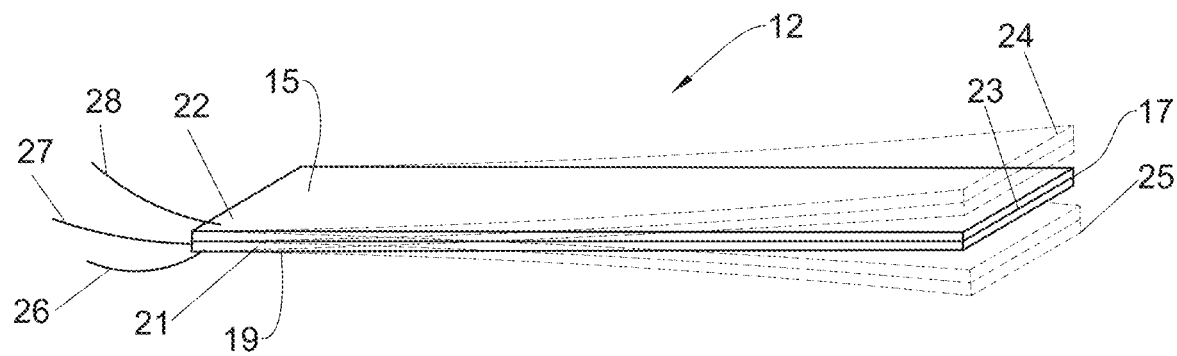
FIG. 2 is a schematic side, perspective view of a piezoelectric flexure bender with electrical connections.

As mentioned, the flexure benders 12 comprise at least a piezoelectric material layer (see e.g. references 21 or 22 in FIG. 2).

According to some embodiments, the flexure benders 12 further include a first electrode layer 19, disposed below said piezoelectric material layer, and a second electrode layer 17 disposed above said piezoelectric material layer.

According to some embodiments (see e.g. FIGS. 8 and 9), the flexure benders 12 include a first electrode layer 19 disposed below a first piezoelectric material layer 21, a second (middle) electrode layer 17 disposed above the first piezoelectric material layer 21, a second piezoelectric material layer 22 disposed above the second electrode layer 17, and a third electrode layer 15 disposed above the second piezoelectric material layer 22. According to some embodiments, the electrode layers 19, 17, 15, can comprise metal.

Each of the piezoelectric material layers 21, 22 can be a relatively thin layer, for example, in the range of 1-25 μm or 1.5-15 μm. These values are however non-limitative.

It should be noted that a flexure bender 12 with two piezoelectric layers can get a bending with a larger amplitude for the same amount of voltage that would be applied to a flexure bender with a single piezoelectric layer. This allows flexure bender 12 to operate at relatively low voltages.

Figure 1B:
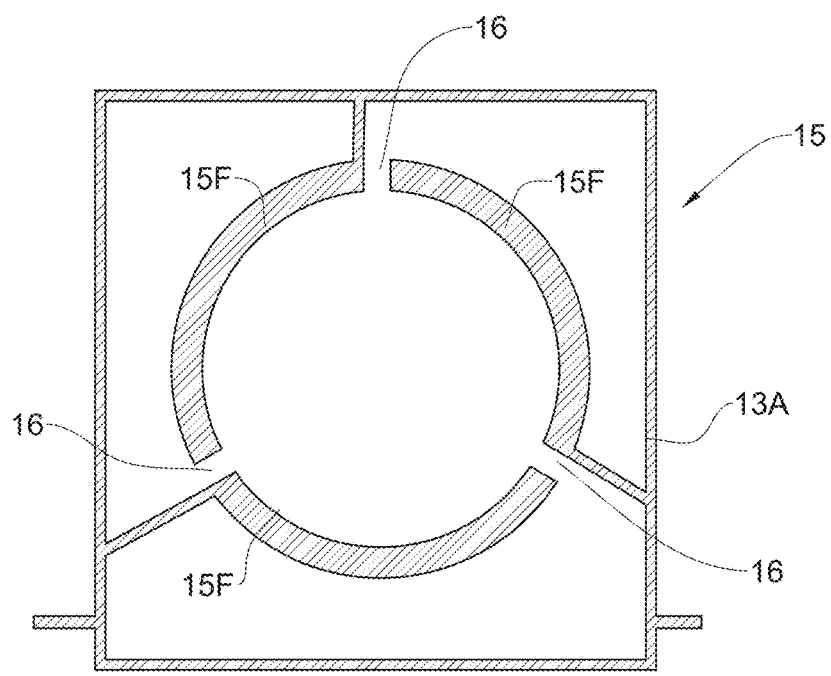
FIG. 1B is a schematic top view of the top electrode layer of the DSR speaker element of FIG. 1A.
Figure 1C:
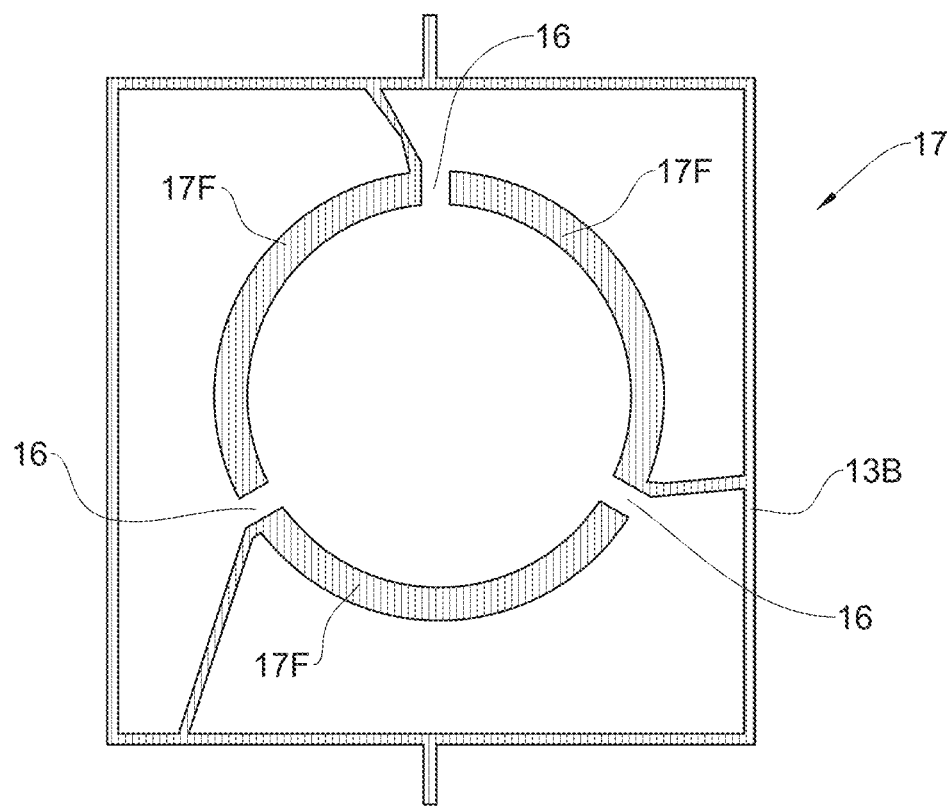
FIG. 1C is a schematic top view of the middle electrode layer of the DSR speaker element of FIG. 1A.
Figure 1D:
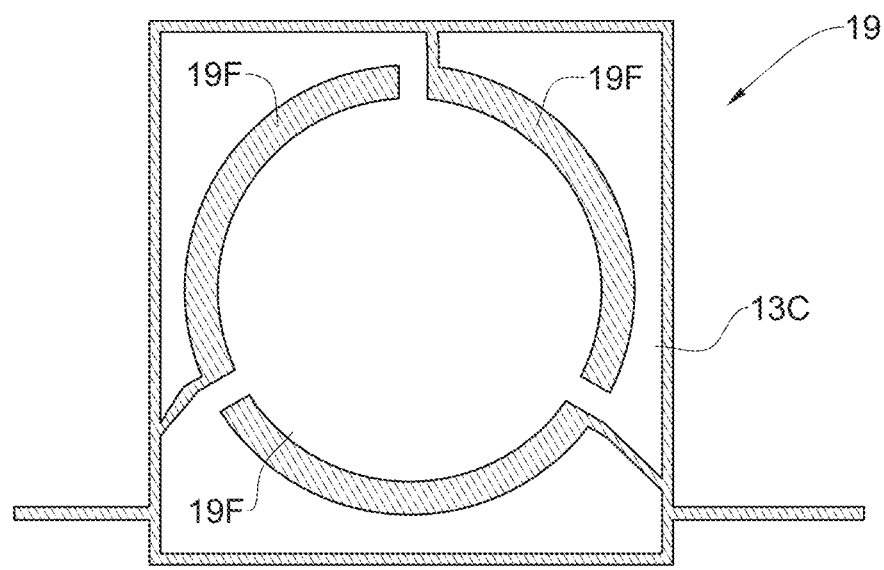
FIG. 1D is a schematic top view of the bottom electrode layer of the DSR speaker element of FIG. 1A.

Attention is now drawn to FIGS. 1B to 1D. Although these Figures represent a configuration in which three electrode layers and two piezoelectric material layers are used, it should be noted that each flexure bender can also comprise only two electrode layers and a single piezoelectric material layer between them, or two electrode layers with a first piezoelectric material layer between the two electrode layers and a second piezoelectric material layer on the top electrode layer.

According to other embodiments, N electrodes layers (with N>3) and N−1 (or N) piezoelectric material layers can be used. In this configuration, there can be alternatively an electrode layer and a piezoelectric material layer.

As shown in FIGS. 1B to 1D, each of electrode layers 15, 17 and 19 include flexure bender shaped electrodes 15F, 17F and 19F (in this embodiment, three electrodes with a curved shape are depicted for each electrode layer) and conductive elements or lines 13 that are used to feed electrical potentials to said electrodes.

As explained later in the specification (see e.g. FIGS. 13 and 14), the representation of the electrodes is schematic and according to some embodiments, at least part of the electrodes may be split into at least two distinct sub-electrodes.

FIG. 1B is a schematic top view of top electrode layer 15. Top electrode layer 15 includes flexure bender shaped electrodes 15F (in this case three peripheral electrodes) and conductive lines 13A in a first pattern or layout. At least one end of each electrode 15F is connected to the conductive lines 13A.

The electrodes 15F are separated one from the other by gaps 16, as already mentioned with respect to FIG. 1.

FIG. 1C is a schematic top view of middle electrode layer 17. Middle electrode layer 17 includes flexure bender shaped electrodes 17F (in this case three peripheral electrodes) and conductive lines 13B in a second pattern or layout different than the pattern of conductive lines 13A.

At least one end of each electrode 17F is connected to the conductive lines 13B.

The electrodes 17F are separated one from the other by gaps 16, as already mentioned with respect to FIG. 1.

FIG. 1D is a schematic top view of bottom electrode layer 19. Bottom electrode layer 19 includes functional electrodes 19F (in this case three peripheral electrodes) and conductive lines 13C in a third pattern or layout different than the pattern of conductive lines 13A or 13B. Electrodes 19F are illustrated as flexure bender shaped, but other shapes and configurations are possible It should be noted that this also applies to the electrodes of electrode layers 15 and 17.

Figure 1E:
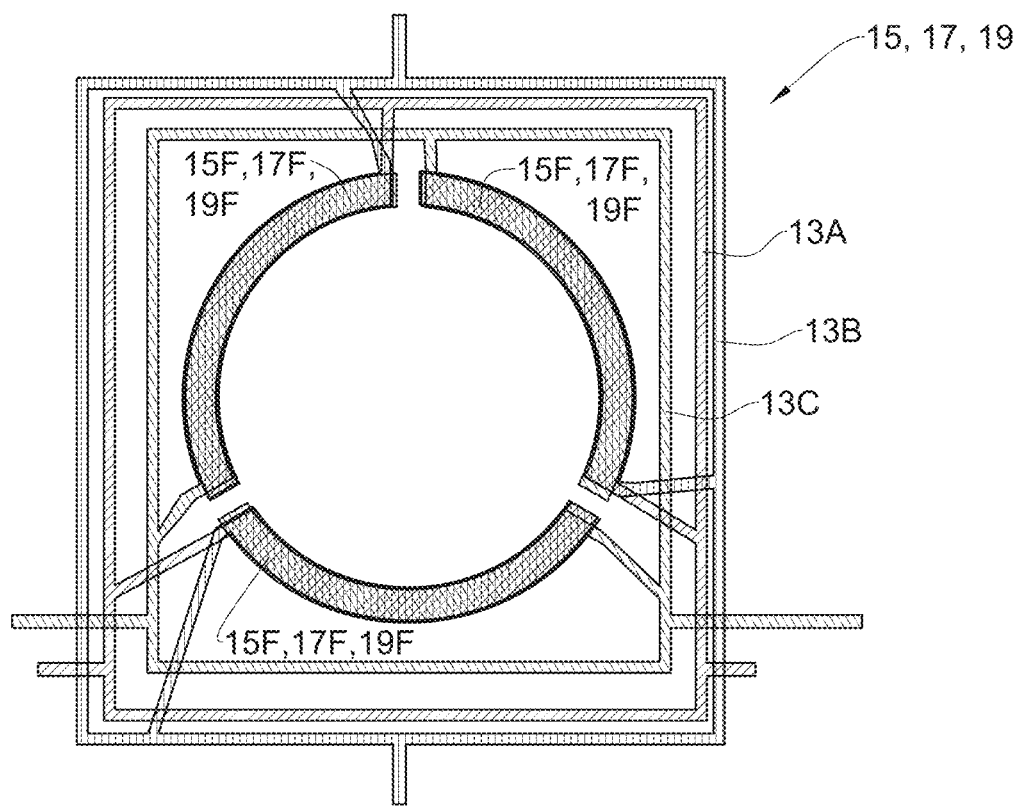
FIG. 1E is a schematic top view of the electrode layers of FIGS. 1B-1D, wherein at least part of the electrode layers are in alignment with each other.

Conductive lines 13A, 13B and 13C of the different electrode layers 15, 17 and 19 have different patterns so that when at least part of the electrode layers 15, 17 and 19 are in alignment in the DSR speaker element 1 (in this case, each electrode of each electrode layer is aligned with the corresponding electrodes of the two other electrode layers, as shown in FIG. 1E), the conductive lines 13A, 13B and 13C are not in alignment. In particular, according to some embodiments, the overlap of conductive lines 13A, 13B and 13C is reduced or minimized in order to minimize parasitic capacitance.

FIG. 1E is a schematic top view of the electrode layers of FIGS. 1B-1D, wherein at least part of the electrode layers are in alignment with each other. The piezoelectric material layers of FIG. 1A are not shown. Electrodes 15F, 17F and 19F of electrode layers 15, 17 and 19 are in alignment in the flexure area, the area designated for flexure benders 12, whereas conductive lines 13A, 13B and 13C are configured to minimize parasitic capacitance by having minimized overlap.

Referring back to FIG. 1A, flexure benders 12 can be configured so that when an electric field is applied to electrode layers 15, 17 and 19, flexure benders 12 bend and move moving element 10 either upward or downward along an axis perpendicular to surface 11. The direction that flexure benders 12 move moving element 10 depends on the direction of the applied electric field. The amplitude that flexure benders 12 move moving element 10 depends on a plurality of factors, for example one of such factors being the amplitude of the applied electric field.

According to some embodiments, electrode layers 15, 17 and 19 in the flexure area of the element are connected in parallel so that flexure benders 12 all work simultaneously.

When the DSR speaker element 1 is a part of an element array forming a DSR speaker, electrode layers 15, 17 and 19 of the DSR speaker elements 1 on the same row or column may be connected in series via conductive lines 13 if passive matrix addressing is used. Passive Matrix addressing is discussed in detail in U.S. Patent Publication Number 2015/0071467, incorporated herein completely by reference (see e.g. paragraphs [0081] and [0098]). The DSR speaker element 1 can also include a substrate base with a cavity and one or more stoppers described in detail below. One can also connect conductive lines 13 of one or more of the layers of each element directly to a voltage source.

Figure 1F:
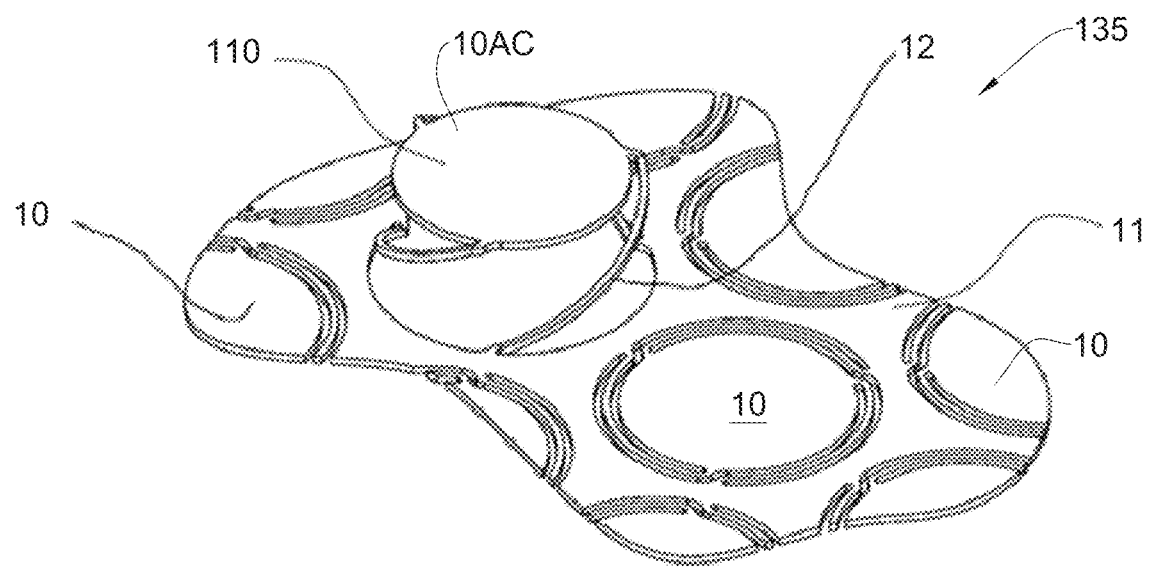
FIG. 1F is a schematic top perspective view of a portion of a DSR speaker array that includes a plurality of the piezoelectric actuated DSR speaker elements of FIG. 1A.
Figure 1G:
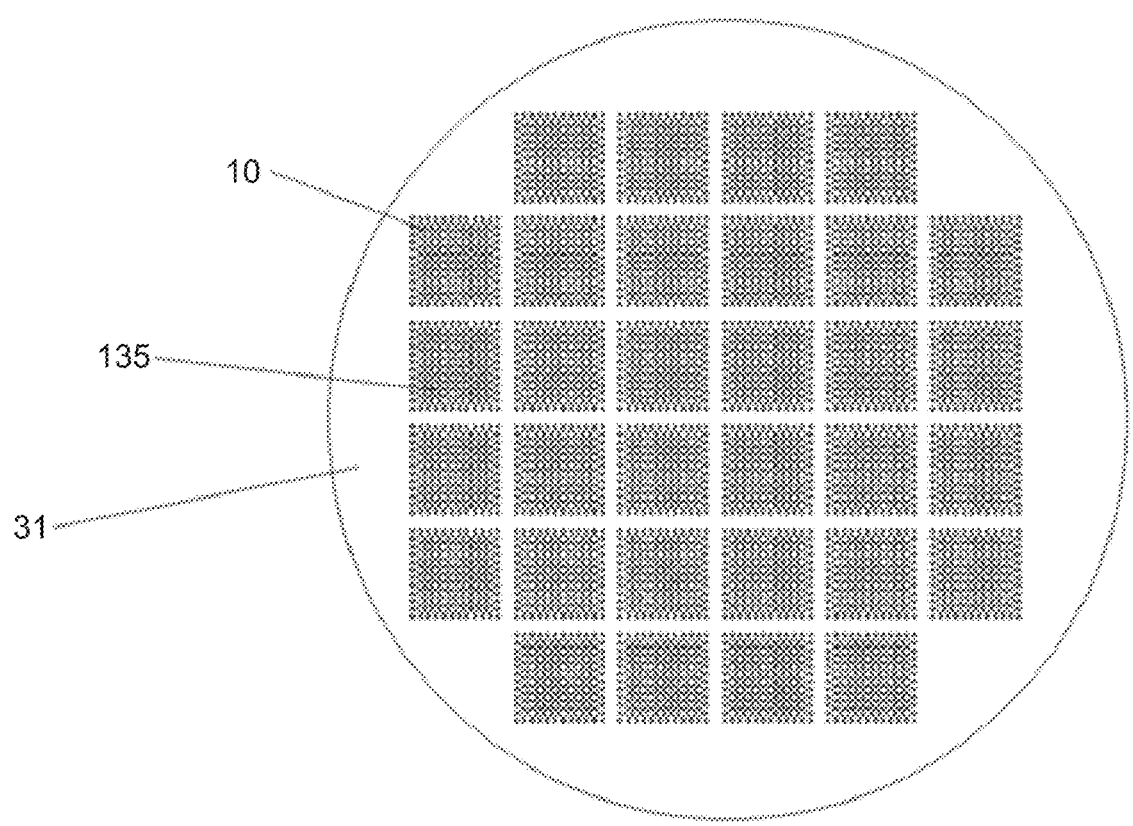
FIG. 1G is a schematic top view of a substrate that includes a plurality of the DSR speaker arrays of FIG. 1F.

Referring now to FIGS. 1F and 1G, a DSR speaker can include a plurality of DSR speaker element 1 having moving elements 10 arranged in arrays 135.

FIG. 1F is a top, perspective view of a portion of a DSR speaker array 135 that includes a plurality of DSR speaker elements each comprising a piezoelectric actuated moving element 10.

In FIG. 1F, the majority of piezoelectric actuated moving elements 10 are shown in their rest position 100, with moving elements 10 on substantially the same plane as area 11 surrounding moving elements 10. One actuated moving element 10AC is shown in an actuated position 110 where actuated moving element 10AC is pushed away (in the upper direction) from surface area 11. Actuated moving element 10AC is moved into actuated position 110 by actuating flexure benders 12 of moving element 10AC. In FIG. 1F, actuated position 110 is exaggerated in order to clearly show and highlight the difference between a non-actuated moving element 10 and actuated moving element 10AC. Typically, the movement of actuated moving element 10AC in each direction is equal to or less than the sum of the thickness of the piezoelectric material and electrode layers added together. This is however non limitative.

FIG. 1G is a schematic top view of a device that includes a plurality of DSR speaker arrays 135 arranged on a substrate 31. In certain embodiments, substrate 31 may look either like a round silicon or glass wafer, or a sheet of silicon or glass. After manufacturing, the DSR speaker arrays may be separated.

FIG. 2 is a side, perspective schematic view of a flexure bender 12. For sake of clarity, it is shown as a rectangular unit. Flexure bender 12 can include two piezoelectric material layers 21 and 22 and three electrodes of the three electrode layers 15, 17, 19. As already mentioned, different numbers of electrode layers and piezoelectric material layers can be used.

According to some embodiments, the flexure bender 12 can comprise at least one insulating layer and at least one additional conductive layer (e.g. in the case where the electrodes are split into sub-electrodes) and/or additional layers.

Piezoelectric layers 21, 22 are sandwiched between the electrodes of the electrode layers 15, 17, 19. An electrode formed in the electrode layer 19 is disposed below the piezoelectric layer 21, an electrode formed in the electrode layer 15 is disposed on top of piezoelectric layer 22, and an electrode formed in the electrode layer 17 is disposed in between piezoelectric layers 21 and 22.

Although FIG. 2 shows a configuration in which every layer totally covers the layer disposed underneath, according to some embodiments, at least part of the layers covers only part of the layer disposed underneath.

When an electric potential is applied on electrode layers 15, 17 and 19, one piezoelectric layer 21 may contract while the other piezoelectric layer 22 may expand, causing a side of flexure bender 12 to move from a first, at rest position 23 downwards towards a second, down position 25. When the opposite potential is applied, one piezoelectric layer 21 may expand while the other piezoelectric layer 22 may contract, causing a side of flexure bender 12 to move upwards from a first, at rest position 23 upwards towards a third, up position 24. The degree of movement of side 23 of flexure bender 12 depends on a plurality of factors, such as (but not limited to): the piezoelectric materials used for piezoelectric layers 21, 22, the layer thickness of piezoelectric layers 21, 22, the voltage applied, the number of the sub-electrodes, their shape and their stimulation scheme and the length of flexure bender 12.

Since the translation achieved from flexure bender 12 is larger when flexure bender 12 is longer for a given electrical field, for a DSR speaker application where one wants to move moving element 10 while keeping moving element 10 substantially flat and parallel to area 11 surrounding moving element 10, flexure benders 12 can be designed according to some embodiments to be as long as possible in order to reduce the operation voltage. This is however not limitative.

In certain embodiments, relatively long flexure benders 12 are arranged along the perimeter of moving element 10. Due to mechanical considerations, according to some embodiments, each flexure bender 12 can be designed to be not much longer than a third of the perimeter around moving element 10 (hence three flexure benders 12 are shown in FIGS. 1A and 1B), to avoid flexure benders 12 bending in the middle rather than pushing moving element 10 up or down. When flexure benders 12 bend, thereby pushing moving element 10 up or down, moving element 10 moves as one substantially flat surface without substantially bending or tilting (the moving element 10 remains substantially parallel to surface area 11).

Referring still to FIG. 2, electrical connections 26, 27 and 28 (which correspond to the part of the conductive lines which extend from each end of each electrode in FIGS. 1B-1D) can connect the electrodes of the electrode layers 15, 17 and 19 to an external electrical component, such as, a source of voltage (not shown). Electrical connection 28 is connected to electrode layer 15, electrical connection 27 is connected to electrode layer 17, and electrical connection 26 is connected to electrode layer 19.

When flexure bender 12 is used as a bender actuator in a DSR speaker, electrical connections 26 and 28 can connect the electrodes of electrode layers 15 and 19 to one of the voltage source's terminals, for example, the negative terminal. Electrical connection 27 can connect the electrode of middle electrode 17 to the other terminal of the voltage source, for example, the positive terminal. A voltage from the voltage source will cause flexure bender 12 to bend.

When a flexure bender 12 is used as a bender sensor in a microphone application, electrical connections 26 and 28 can connect the electrodes of electrode layers 15 and 19 to one terminal of an amplifier, and electrical connection 27 can connect the electrode of middle electrode layer 17 to the other terminal of the amplifier. When flexure bender 12 is bent in either direction in response to pressure, for example, from the sound pressure waves, a small voltage will develop between electrode layers 15, 17 and 19 that may be amplified by an amplifier.

FIGS. 3-7 illustrate an unfinished piezoelectric element (here after "unfinished sound pressure producing element" or "unfinished element") at various stages during a process, in accordance with certain embodiments, for manufacturing piezoelectric elements, such as the DSR speaker element 1 that was described in detail above. Vertical dimensions are exaggerated in order to highlight certain elements in portions of the Figures. In certain embodiments, the substrate may have a thickness of around 500 µm or other as determined by manufacturing and acoustic issues and the upper layers will have a total thickness closer to 3.5 µm. These values are however non limitative. The terms "disposed", "deposited", "disposing" and "depositing" can refer to direct disposing without any intermediate layers, or indirect disposing including an intermediate layer or intermediate layers.

Figure 3:
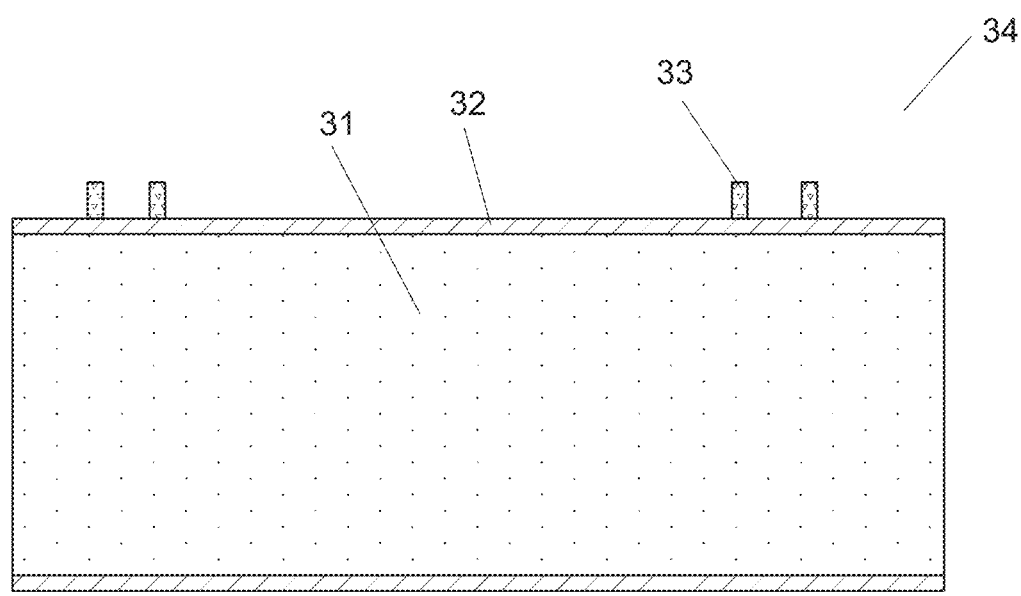
FIG. 3 is a schematic side, cross-section view of an unfinished DSR speaker element including fins, according to one embodiment.

FIG. 3 is a side, cross-section view of an unfinished DSR speaker element 34 including fins 33. Unfinished element 34 includes a substrate 31 onto which a sacrificial layer 32 is added.

In certain embodiments, substrate 31 can be silicon or glass wafers that can vary in diameter from 100 mm to 450 mm, or silicon or glass sheets that can be larger than 450 mm on the side. These values are however not limitative.

Sacrificial layer 32 can be partially removed at a later stage in the process to create a space to allow a moving element 10 that will be added later, the freedom to move away from substrate 31 (or towards substrate 31). The process of disposing sacrificial layer 32 can comprise a step of disposing a layer of sacrificial material on either side of substrate base 31. Sacrificial layer 32 may be made from any appropriate material, such as, silicon dioxide material, added or grown on to substrate base 31. Other materials can be used.

Unfinished element 34 also includes temporary fins 33, disposed on the sacrificial layer 32, or on the substrate 31.

Fins 33 can be made from a material (or from a plurality of materials) that can later be removed, for example, by chemical dissolving. Fins 33 can be made of material that can be selectively removed later on without damaging other layers, such as, piezoelectric material layers 21, 22, electrode layers 15, 17, and 19, or sacrificial layer 32. According to some embodiments, the material(s) used for fins 33 may also be capable of withstanding relatively high temperatures appropriate for processing or sintering piezoelectric material or crystallizing piezoelectric material. The material(s) from which fins 33 are constructed may be different than the material of sacrificial layer 32. As an example, fins 33 can be constructed from a layer of poly-silicon that is deposited on top of sacrificial layer 32 and later defined by lithography processes to limit the layer of poly-silicon to the desired shape of the fins.

Fins 33 are constructed in a manner so that fins 33 can be removed at a later stage in the process to create gaps 14. According to some embodiments, the gaps 14 are created in piezoelectric layers 21, 22, and define the functional section of flexure benders 12. Thus, fins 33 can have the same shape as the desired gaps 14 that are to be formed as shown e.g. in FIG. 1.

Figure 3A:
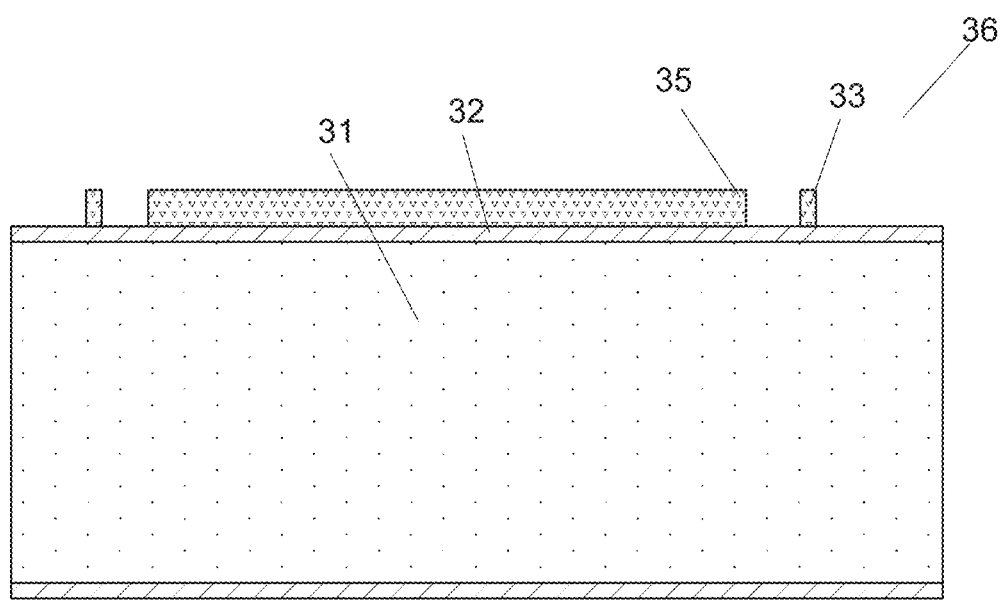
FIG. 3A is a schematic side, cross-section view of an unfinished DSR speaker element including fins, and a layer for the moving element which is made of non-piezoelectric material, according to one embodiment.

FIG. 3A shows yet another embodiment of an unfinished DSR speaker element 36, which comprises fins 33 and sacrificial layer 32.

In this embodiment, a layer 35 which is used for constructing the moving element portion does not comprise piezoelectric material. According to some embodiments, the layer 35 that is used to construct the moving element 35 is made of the same material as the fins 33.

This can result in a moving element with a smaller mass than one made from piezoelectric material that may be of high density and harder to move at high frequencies.

Figure 4:
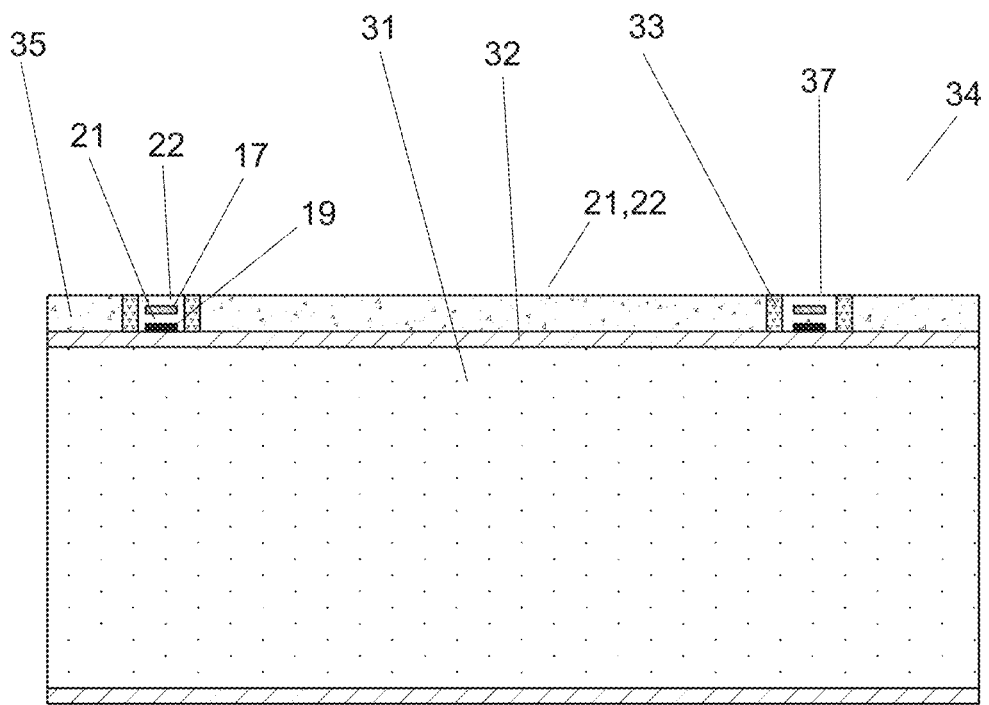
FIG. 4 is a schematic side, cross-section view of the unfinished DSR speaker element of FIG. 3 including electrode layers and piezoelectric layers.

FIG. 4 is a side, cross-section view of the unfinished element 34 of FIG. 3 including electrode layers 17, 19 and piezoelectric layers 21, 22 deposited on top of substrate 31.

Substrate 31 and sacrificial layer 32 (support and sustain thin piezoelectric material layers 21, 22. The piezoelectric material layers 21, 22 are also present on a central portion of the sacrificial layer 32

A first electrode layer 19, smaller than the surface area of substrate base 31, is patterned on top of sacrificial layer 32 in the flexure areas 37, the area designated for flexure benders 12.

Electrode layer 19 can also include conductive lines 13C to connect the different electrodes 19F of the same layer to each other, and/or to neighboring elements and/or to a voltage supply point, to enable simultaneous operation of flexure benders 12.

The formation of the electrode layer 19 can comprise depositing the material of the electrode layer 19 (such as metal) and then etching gaps in the metal to obtain the desired shape of the electrode layer 19 (that is to say the different electrodes, the conductive lines and other structures in the electrode layer). In certain embodiments, electrode layer 19 can be formed by depositing photo-resist material on portions where gaps in the metal are to be formed and then depositing metal to obtain the desired shape and then removing the photo resist material ("lift off").

A first piezoelectric material layer 21 can be disposed on top of electrode layer 19. A second flexure bender shaped electrode layer 17, smaller than the surface area of substrate base 31, can be patterned on top of first piezoelectric layer 21 in the flexure areas 37, the area designated for flexure benders 12, wherein at least part of the second electrode layer 17 is in alignment with the first electrode layer 19.

Electrode layer 17 can also include conductive lines 13B to connect the different electrodes 17F of the same layer to each other and to neighboring elements and/or to a voltage supply point on the same element.

The electrode layer 17 can be formed using similar techniques as the techniques described for electrode layer 19.

Conductive lines 13B and 13C can be configured to minimize parasitic capacitance by having minimized overlap, as already explained with reference to FIG. 1E.

A second piezoelectric material layer 22 can be disposed on top of second electrode layer 17. The second piezoelectric material layer 22 can be a thin layer. According to some embodiments, the second piezoelectric material layer 22 is not deposited and there is only a single piezoelectric material layer between the first electrode layer 19 and the second electrode layer 17.

The construction of practical DSR speaker arrays 135 can require using stacks of piezoelectric layers in the thickness range of 1-25 μm or 1.5-15 μm.

Handling and transporting of thin films of piezoelectric material in such a thickness range can be challenging since piezoelectric layers that are that thin are very fragile, and are often unable to sustain or support their own weight, depending on the size of their height and length.

It would be extremely difficult to first make thin piezoelectric sheets in such a thickness range separate from substrate 31 and then transport and bond such piezoelectric sheets to substrate 31. Therefore, piezoelectric material can be first disposed on substrate 31 to form thin piezoelectric layers which are supported by substrate 31 and sacrificial layer 32, and then flexure benders 12 can be defined.

Substrate 31 can be made from a relatively stable material, and can comprise, for example, silicon, glass or any other suitable material used as a carrier material to support the piezoelectric material layers until the gaps 14 are formed that define the flexure benders and the moving element.

After the gaps 14 are formed, a portion of substrate 31 can be removed to create a cavity 800 (see e.g. FIG. 8) that may be required for the etch of the sacrificial layer 32 and/or the acoustic performance of the DSR speaker.

When using fins 33 on top of substrate 31, and if the piezoelectric layers are constructed using pressing technology, one may use a buffer material when pressing the bottom piezoelectric layer 21 so as to avoid damaging fins 33 during the pressing operation. This buffer material may be in liquid form.

The depositing or forming of piezoelectric material layers 21, 22 can be done using different methods known in the art such as sputtering, sol-get deposition, and pressing a fine powder (particle size less than 2 μm) of the un-sintered piezoelectric material as is, or mixed with a binder. in some cases, these steps are followed by thermal treatment for sintering or recrystallization of the piezoelectric material. The piezoelectric material layers 21, 22 can be polarized between the contact electrodes 15, 17, 19 by applying a potential between electrodes 15, 17, 19 after the device manufacturing is completed.

Bottom piezoelectric layer 21 may be thermally treated before the addition of thin conductive electrode layer 19. Alternatively, bottom piezoelectric material layer 21 can be thermally treated together with thin conductive electrode layer 19 after electrode layer 19 has been added. Further alternatively, bottom piezoelectric material layer 21 can be thermally treated together with thin conductive electrode layer 19 and the top piezoelectric material layer 22. After depositing conductive electrode layers 17, 19 and piezoelectric material layers 21, 22, before or after thermal treatment, the top surface of fins 33 can be polished. Polishing may be done to gain access to fins 33 material after other material has been deposited on top of fins 33. Polishing can be followed by removal of fins 33 (for example, by the dissolving of the material of fins 33) which leaves a piezoelectric material surface with gaps 14 that define flexure benders 12. Fins 33 may be removed using removing processes such as, dry etch, wet etch, chemical dissolution, or any other suitable process.

Figure 4A:
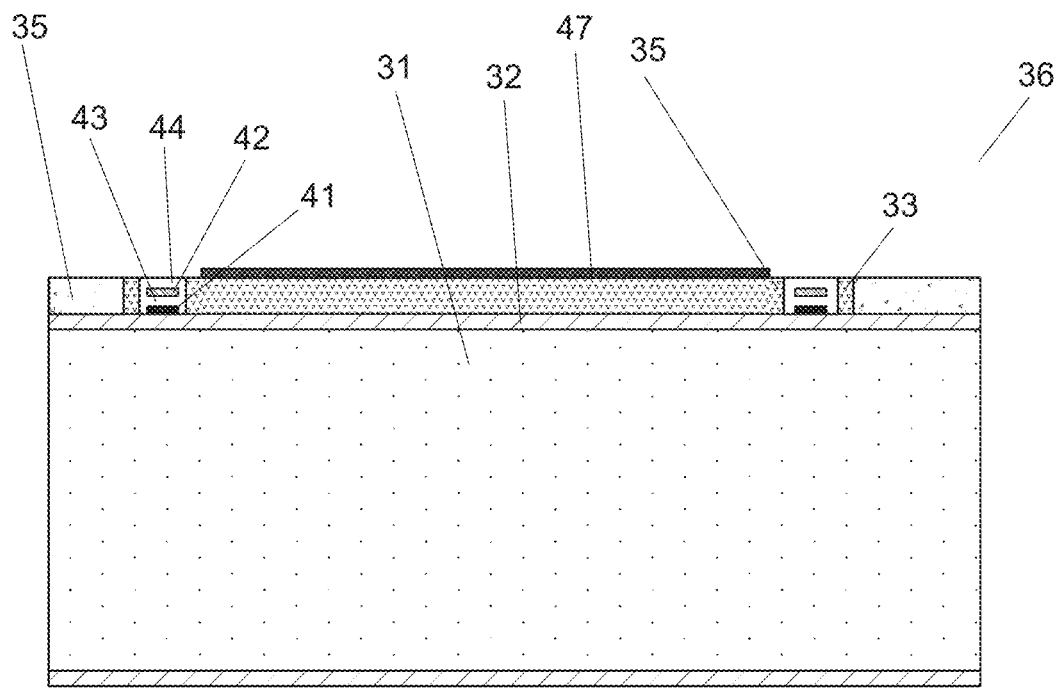
FIG. 4A is a schematic side, cross-section view of the unfinished DSR speaker element of FIG. 3A including electrode layers, piezoelectric layers and a mask layer.

FIG. 4A is similar to FIG. 4, but shows the unfinished element 36 of FIG. 3A. Similarly to what was described with respect to FIG. 4, a first electrode layer 41 (similar to electrode layer 19) can be deposited. In this case, the first electrode layer 41 is deposited and patterned as explained above. A first piezoelectric material layer 43 can be deposited on the first electrode layer 41, a second electrode layer 42 can be deposited and patterned on the first piezoelectric material layer 43, and a second piezoelectric material layer 44 can be deposited on the second electrode layer 42.

As already mentioned with respect to FIG. 4A, layer 35, which defines the moving element, does not comprise piezoelectric material and can be made of the same material as the fins 33.

In the embodiment of FIG. 4A, an additional mask 47 is disposed on the layer 35 in order to protect this layer 35 when the fins 33 will be etched to create the gaps 14. Said mask 47 can be made from any suitable material used in photo lithography, and/or can also be a hard mask made of metal, Silicon Dioxide, aluminum oxide or any other material that can resist the etching process of the fins 33.

Figure 5:
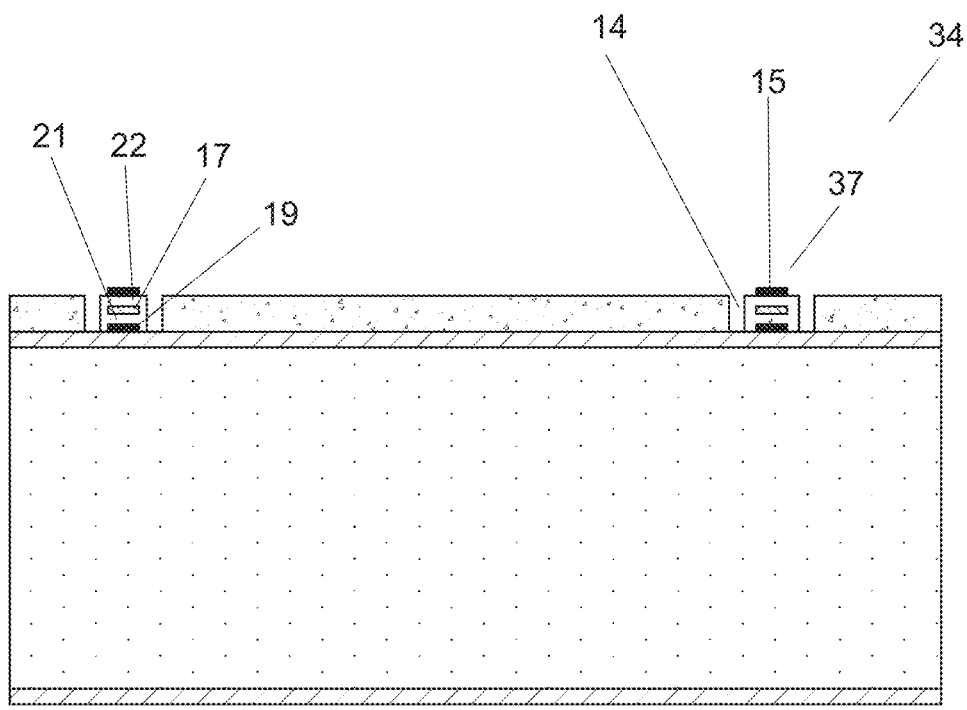
FIG. 5 is a schematic side, cross-section view of the unfinished DSR speaker element of FIG. 4 where the fins have been removed and the top electrodes added.

FIG. 5 is a side, cross-section view of the unfinished element 34 of FIG. 4 where fins 33 have been removed.

Removing fins 33 is done to define flexure benders 12 and moving element 10 by forming gaps 14 between flexure benders 12, moving element 10, and surrounding piezoelectric material 11. Unfinished element 34 of FIG. 5 includes a third flexure bender shaped electrode layer 15, smaller than the area of substrate base 31, disposed on piezoelectric layer 22 in the flexure bender areas 37, wherein at least part of the third electrode layer 15 is in alignment with at least part of first electrode layer 19 and second electrode layer 17. Electrode layer 15 includes conductive lines 13A to connect the different electrodes 15F of the same layer to each other and to neighboring elements and/or to a voltage supply point on the same element. Electrode layer 15 can be disposed on piezoelectric layer 22 either before or after the forming of gaps 14 (gaps 14 being formed, for example, by removal of fins 33 which are the negative shapes of gaps 14). The patterning of electrode layer 15 can be done by similar methods to those used to shape the electrode layers 17 and 19.

Figure 5A:
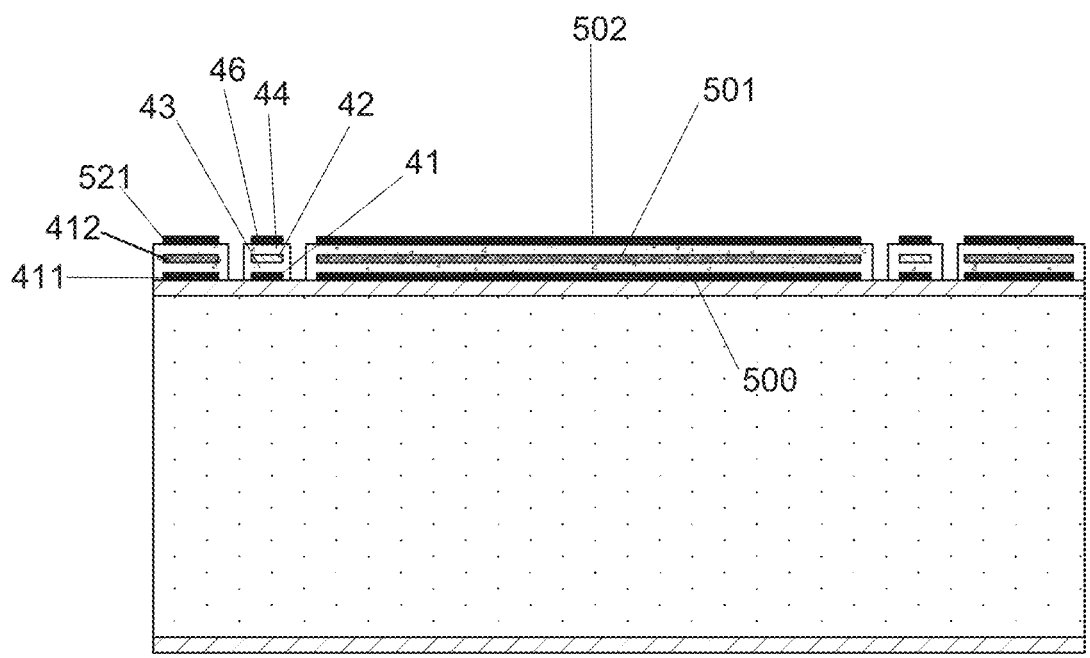
FIG. 5A is a variant of the embodiment of FIG. 5 in which the different electrode layers are present above most of the surface of the substrate.

FIG. 5A is similar to FIG. 5 but in this case, the different electrode layers are present on most of the surface.

The portions 41, 42, and 46 of the first, second and third electrode layers are present in the flexure benders.

The portions 411, 412 and 521 of the first, second and third electrode layers are present in the surrounding area 11, and the portions 500, 501 and 502 of the first, second and third electrode layers are present in the layer which will be part of the central moving portion 10.

As already mentioned, the portions 41, 42 and 46 are connected to an electric potential. In this embodiment, the other portions 411, 421, 521 and 500, 501, 502 are not connected to any electric potential. These other portions can make some processes easier to perform.

Figure 5B:
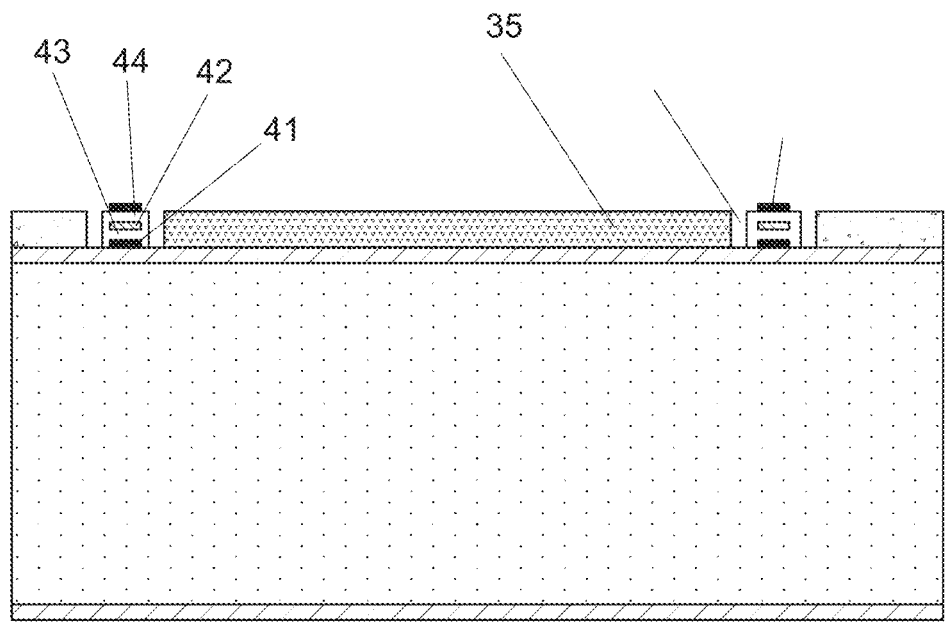
FIG. 5B is a schematic side, cross-section view of the unfinished DSR speaker element of FIG. 4A wherein the fins have been removed and top electrodes have been added, according to one embodiment.

FIG. 5B is similar to FIG. 5 but in this embodiment, the moving element is not made of piezoelectric material.

Figure 5C:
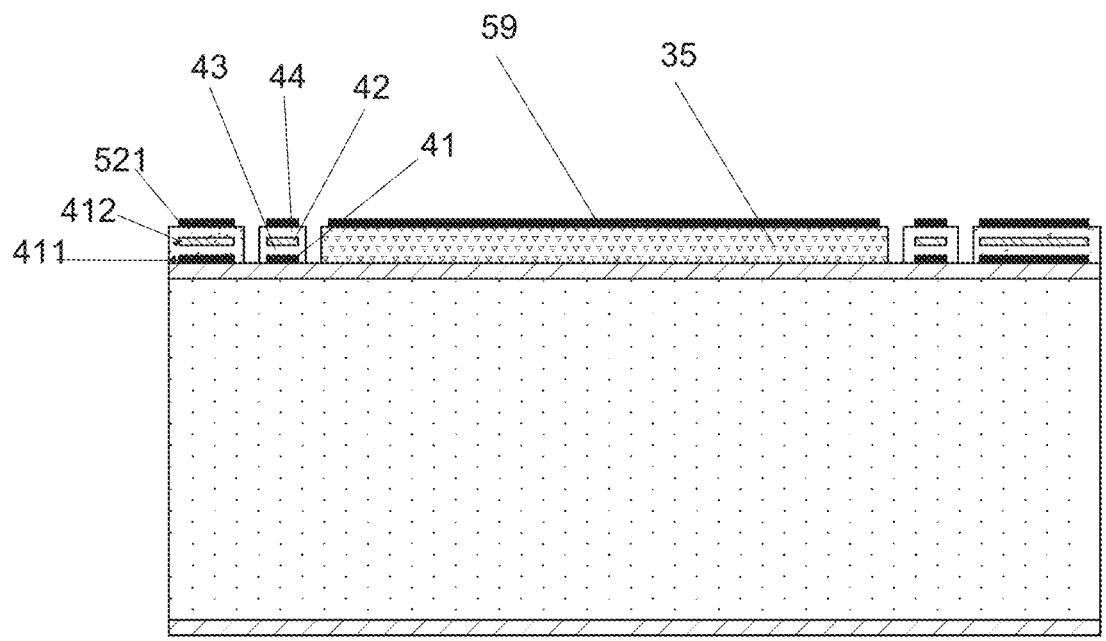
FIG. 5C is similar to FIG. 5B but in this case, the different electrode layers are present above most of the surface of the substrate.

FIG. 5C is similar to FIG. 5B but in this case, the different electrode layers portions are present above most of the surface of the element.

The portions 41, 42, and 46 of the first, second and third electrode layers are present in the flexure benders.

The portions 411, 412 and 521 of the first, second and third electrode layers are present in the surrounding area 11, and the portion 59 of the third electrode layer is present on the layer 35 which will be part of the central moving portion 10.

As already mentioned, the portions 41, 42 and 46 are connected to an electric potential. In this embodiment, the other portions 411, 421, 521 and 59 are not connected to any potential and are left electrically floating. These other portions can be useful to ease some processing of the unfinished element of FIG. 5C.

Figure 6:
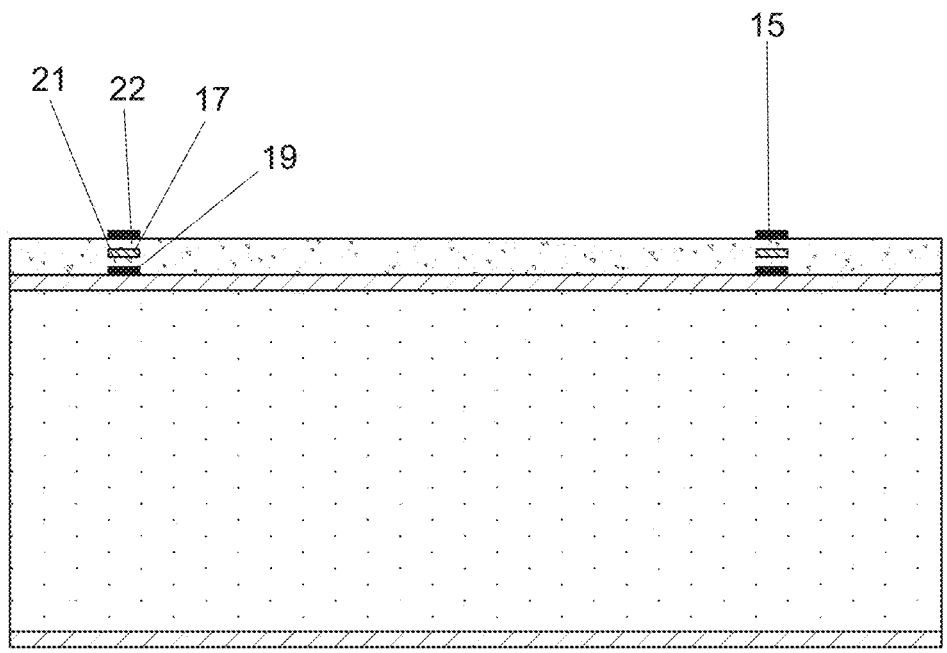
FIG. 6 is a schematic side, cross-section view of an unfinished DSR speaker element without fins, according to one embodiment.
Figure 7:
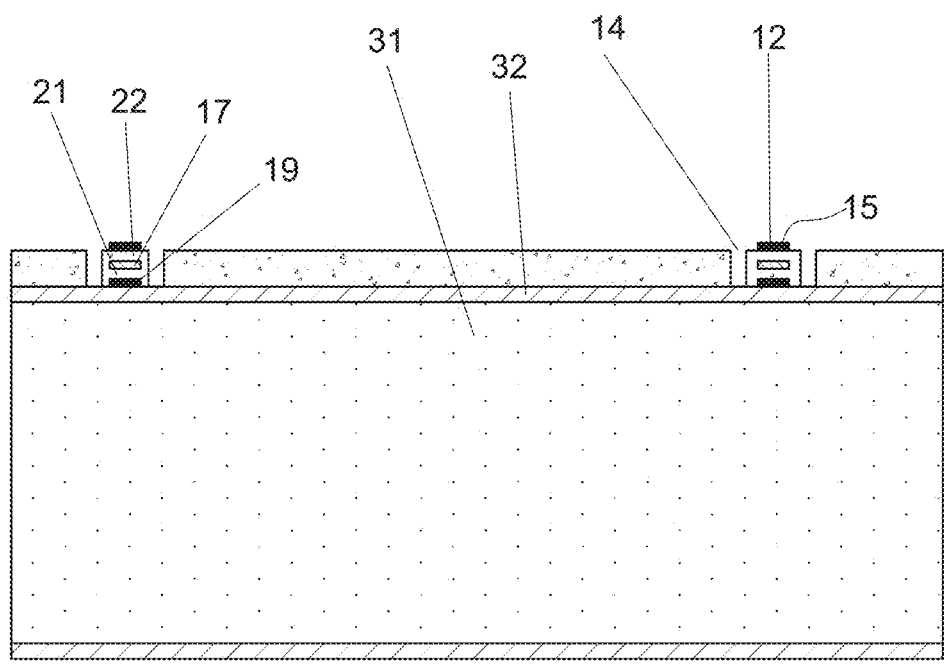
FIG. 7 is a schematic side, cross-section view of the DSR speaker element of FIG. 6 after the formation of gaps for defining different functional sections.

FIG. 6 is a side, cross-section view of an unfinished element without fins, and FIG. 7 is a side, cross-section view of the unfinished speaker element of FIG. 6 including gaps 14, according to an alternative embodiment. In the embodiment of FIG. 6 and FIG. 7, gaps 14 that define flexure benders 12 are created without fins by using alternative removal techniques, for example: removing material using laser cutting, lithography, dry etch processes, wet etch processes, or other suitable processes. The forming of gaps 14 can be performed by the above listed techniques either before or after the sintering of the piezoelectric material. The gaps 14 can be formed by removing material in the piezoelectric material layer (in this case layers 21 and 22), on each side of a section comprising a portion of the first electrode layer, a portion of the first piezoelectric material layer, a portion of the second electrode layer and a portion of the second piezoelectric material layer (if present, also a portion of the third electrode layer).

The unfinished element of FIG. 7 is substantially the same as the unfinished element of FIG. 5. The forming of gaps 14 (which will allow defining the flexure benders 12) can be performed by the above listed techniques for example either before or after the sintering of the piezoelectric material.

Figure 6A:
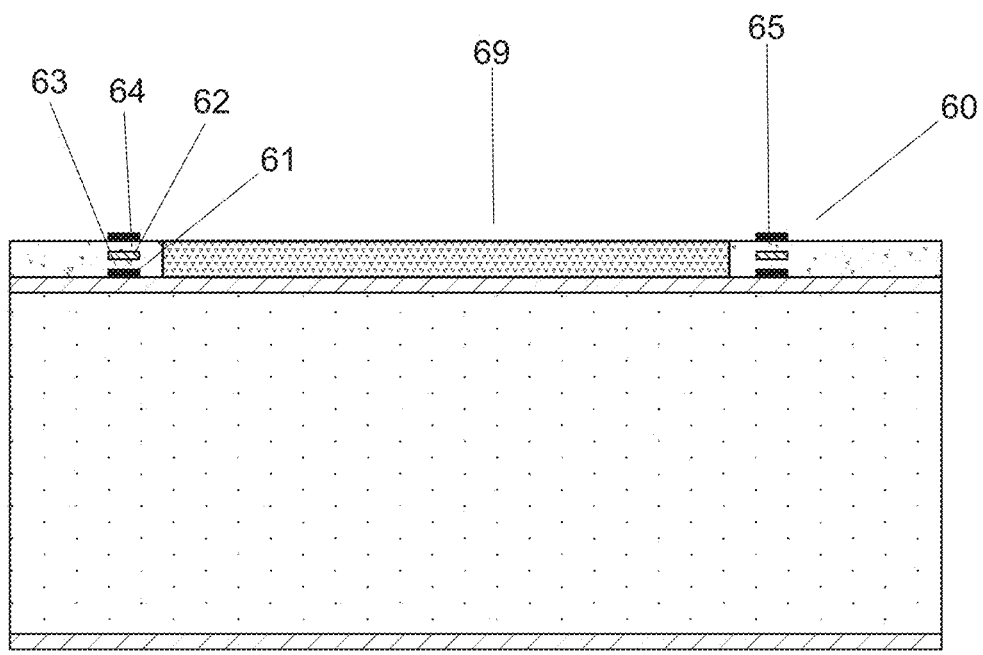
FIG. 6A is a schematic side, cross-section view of an unfinished DSR speaker element without fins and including a layer which does not comprise piezoelectric material and which will be part of the central moving element, according to another embodiment.

FIG. 6A is similar to FIG. 6 but in this embodiment, the layer 69, which will constitute the central moving element 10, does not comprise piezoelectric material.

Figure 7A:
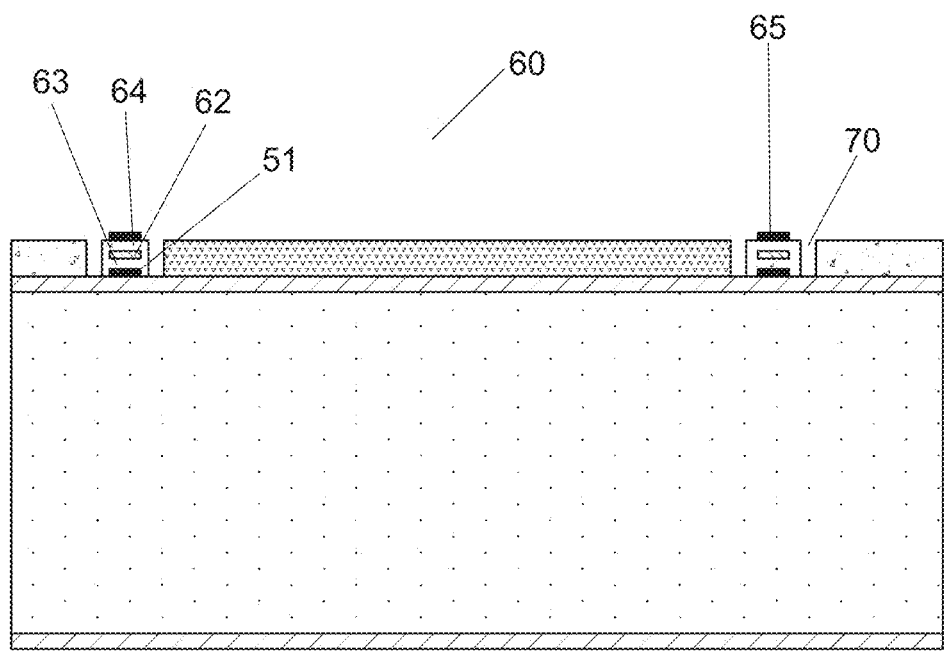
FIG. 7A is a schematic side, cross-section view of the DSR speaker element of FIG. 6A after the formation of gaps for defining different functional sections and with moving element that is not made of piezoelectric material.

FIG. 7A represents the unfinished element 60 of FIG. 6A after the formation of gaps 70 on each side of a section comprising the first electrode layer 61, a portion of the first piezoelectric material layer 63, the second electrode layer 62, a portion of the second piezoelectric material layer 64, and the third electrode layer 65. The gaps 70 can be formed with at least one of the techniques mentioned with respect to FIG. 7.

Figure 8:
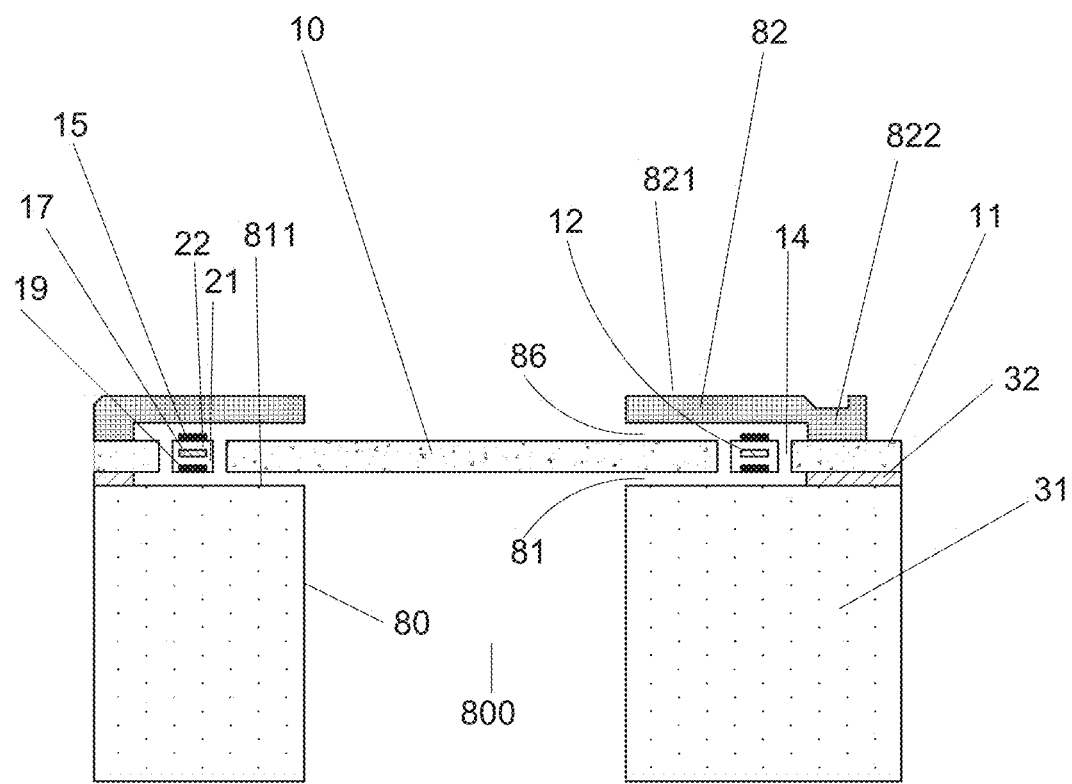
FIG. 8 is a side, cross-section view of an embodiment of a finished DSR speaker element.

FIG. 8 is a side, cross-section view of an embodiment of a DSR speaker element 1.

The DSR speaker element 1 can comprise a moving element 10, flexure benders 12 connected to the moving element 10, and a surrounding piezoelectric material layer 11. Gaps 14 are present between the flexure benders 12 and the moving element 10, and between the flexure benders 12 and the surrounding piezoelectric material layer 11.

As shown in FIG. 8, a cavity 800 can be formed for the acoustic performance of the DSR speaker element 1.

Cavity 800 can be formed in the substrate base 31, at a first diameter 80 smaller than the diameter of a portion comprising the moving element 10 and flexure benders 12. Cavity 800 can also be used as an access opening for etching a portion of sacrificial layer 32 at a second diameter larger than diameter 80.

Etching sacrificial layer 32 serves to create a first gap or space 81 between the moving element 10 and the substrate base 31, in which the moving element 10 can move. As shown in FIG. 8, as sacrificial layer 32 is etched, flexure benders 12 are undercut leaving first gap or space 81, having a larger diameter than diameter 80 of first cavity 800, open between substrate 31 and flexure benders 12. Space 81 has a diameter that is larger than the diameter of the moving element 10 and the flexure benders 12.

On one side of moving element 10, between moving element 10 and substrate 31, moving element 10 is able to move within space 81 by bending flexure benders 12 in a first direction towards substrate 31 until moving element 10 reaches a surface 811 of substrate material 31.

The range of motion of moving element 10 is limited in the first direction by surface 811. Surface 811 can serve as a first stopper 811 of the motion of moving element 10. On the other side of moving element 10, moving element 10 is free to move. A second stopper 82 can be formed limiting the movement of moving element 10 within a second space 86 having a diameter larger than the diameter of the portion comprising moving element 10 and flexure benders 12.

According to some embodiments, the second stopper 82 has a radial portion 821 for stopping the motion of moving element 10, and an anchor portion 822 for anchoring the second stopper 82 to the surrounding piezoelectric material layer stack 11.

Moving element 10 is able to move within space 86 by bending flexure benders 12 in a second direction away from substrate 31 until moving element 10 reaches the second stopper 82. Thus, the range of motion of moving element 10 is limited in the second direction by the second stopper 82.

The range of motion of moving element 10 is thus limited by stoppers 82, 811 on either side of moving element 10.

According to some embodiments, bottom stopper 811 and/or top stopper 82 can be rigid. According to some embodiments, bottom stopper 811 and/or top stopper 82 can facilitate acoustic performance, and enable passive matrix addressing.

According to some embodiments, top stopper 82 can be made using an electroforming process on top of DSR speaker element 1.

According to some embodiments, top stopper 82 can be made by bonding pre-fabricated stoppers 82 with anchor portions 822 to DSR speaker element 1.

When designing moving element 10 for an array 135 in order to make a DSR speaker, other considerations may be taken into mind. According to some embodiments, the natural resonance frequency of moving element 10 and flexure benders 12 may correspond to the drive clock. In addition, gaps 14 in the piezoelectric material layers that define piezoelectric flexure benders 12 from the rest of the layer stack area 11 may be small enough so as to minimize acoustic short between the two sides of moving element 10. According to some embodiments, the total translation of moving element 10 may be smaller than or equal to the total thickness of the layers that are part of flexure benders 12.

According to some embodiments, the ratio of thickness of flexure benders 12 to the width of gap 14 is larger than 2. This value is however not limitative.

According to some embodiments, the shape of one or more electrode layers 15, 17 and 19 may be limited to the areas just below or over piezoelectric layers 21, 22 making flexure benders 12 for actuation and narrow conductive lines 13 to connect speaker element 1 as a part of a speaker element array 135 required to construct a DSR speaker.

Using electrodes 15F, 17F and 19F of the required shape ensures bending of only flexure benders 12 and not of moving element 10. The overlap of conductive lines 13A, 13B, 13C may be minimized so as to reduce the parasitic capacitance. For this reason, it is better if conductive lines 13A, 13B and 13C connecting the electrodes 15F, 17F and 19F of each layer 15, 17 and 19 have a minimal overlap. Also, this conductive line layout ensures that the piezoelectric material polarization will take place almost only in the area of flexure benders 12 where polarization potential is created when applying voltage to these conductive lines 13.

Alignment structures (not shown) can be used to enable the alignment of elements that are being deposited with previously deposited elements that have been buried by other layers.

For example, alignment structures can be used to align electrode layer 17 with electrode layer 19 buried below piezoelectric material layer 21. In order to expose the alignment structures and enable precise alignment, windows can be opened in the layers (meaning a portion of the upper layers are removed) above the alignment structures in the general area of where the buried elements are located to expose the alignment structures for the alignment process. The alignment marks do not have to be placed in the element area or in the DSR array but can reside in the open areas between the arrays that are later used for cutting the finished product into single DSR speaker arrays.

Figure 8A:
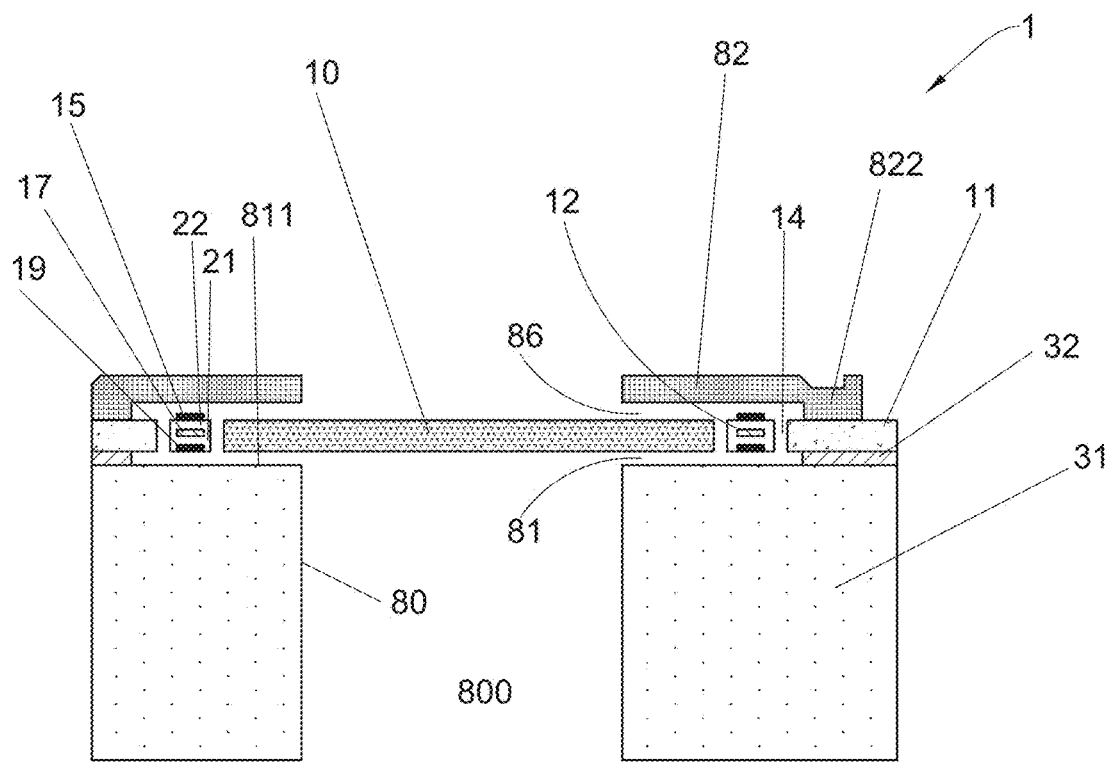
FIG. 8A is a schematic side, cross-section view of a finished DSR speaker element, wherein the central moving element does not comprise piezoelectric material, according to another embodiment.

FIG. 8A is similar FIG. 8 but in this embodiment, the moving element 10 does not comprise piezoelectric material.

Figure 9:
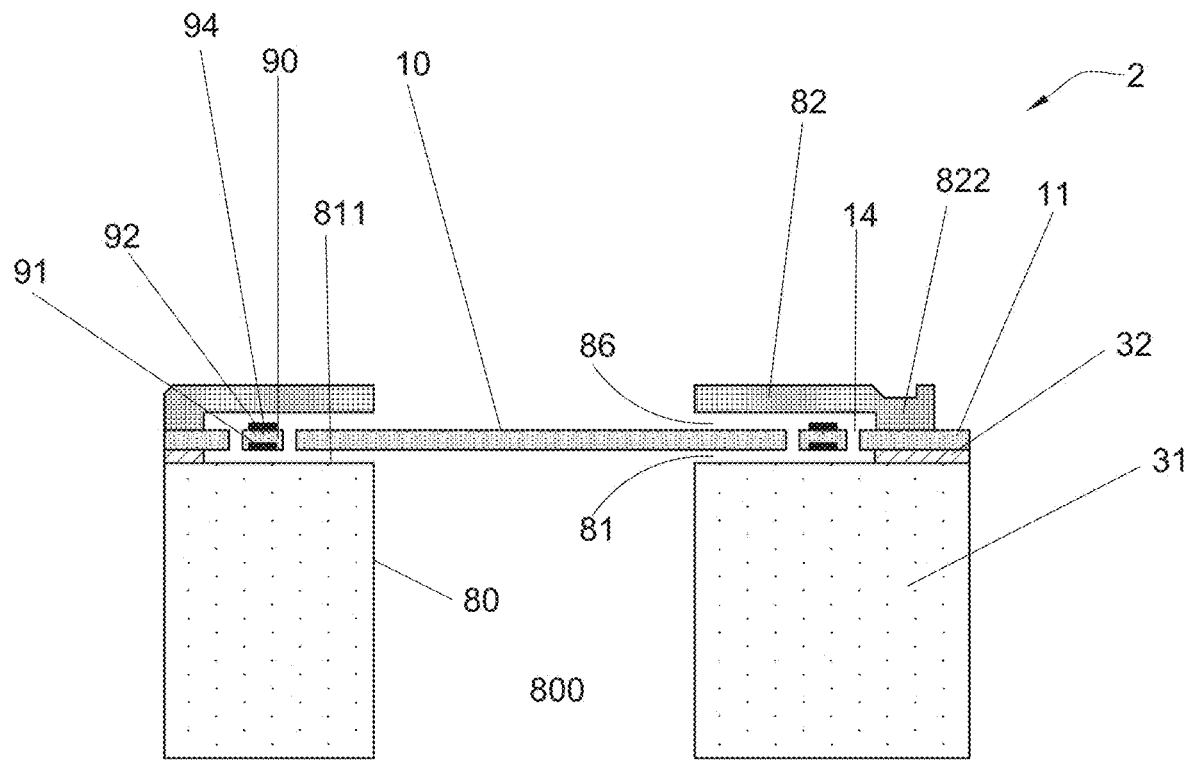
FIG. 9 is a schematic side, cross-section view of a finished DSR speaker element with two electrode layers, according to another embodiment.

FIG. 9 is a side, cross-section view of a DSR speaker element 2 with two electrode layers, according to another embodiment. The DSR speaker element 2 comprises flexure benders 90 which comprise a single piezoelectric material layer 92 sandwiched between a first bottom electrode layer 91 and a second top electrode layer 94. In certain embodiments, one of the electrode layers 91 or 94 may be thinner or thicker than the other electrode layer, and thick enough to resist lateral shrinking (that is to say thick enough to resist contraction and expansion to enable flexure bender 90 to bend).

According to certain embodiments, a flexure bender that comprises two piezoelectric layers, one expanding piezoelectric layer on top of another piezoelectric layer that contracts, will have a larger translation per applied electrical field than a flexure bender 90 that comprises a single piezoelectric layer 92 on top of another supplemental material or just a single piezoelectric layer 92 by itself.

In certain embodiments, conductive lines 13 or flexure bender shaped electrodes can be defined by creating gaps in a continuous electrode layer.

Figure 10:
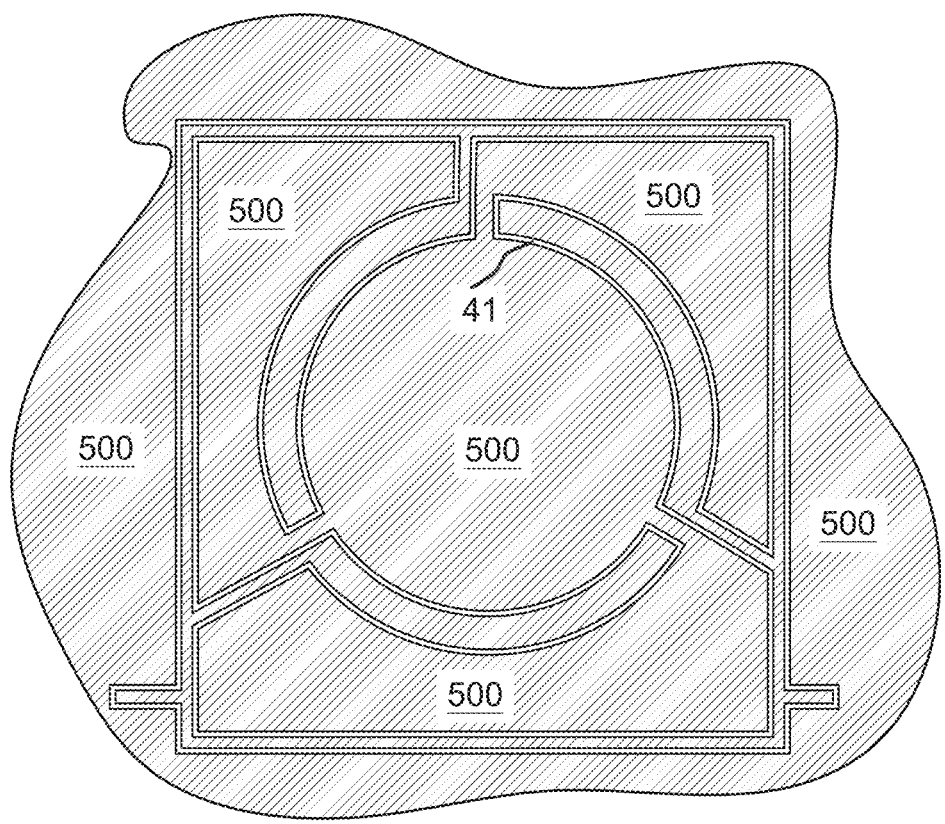
FIG. 10 is a schematic top view of an electrode layer including non-functional metal portions, according to another embodiment.

FIG. 10 is a schematic top view of an electrode layer including non-functional metal portions 500, according to another embodiment.

Figure 11:
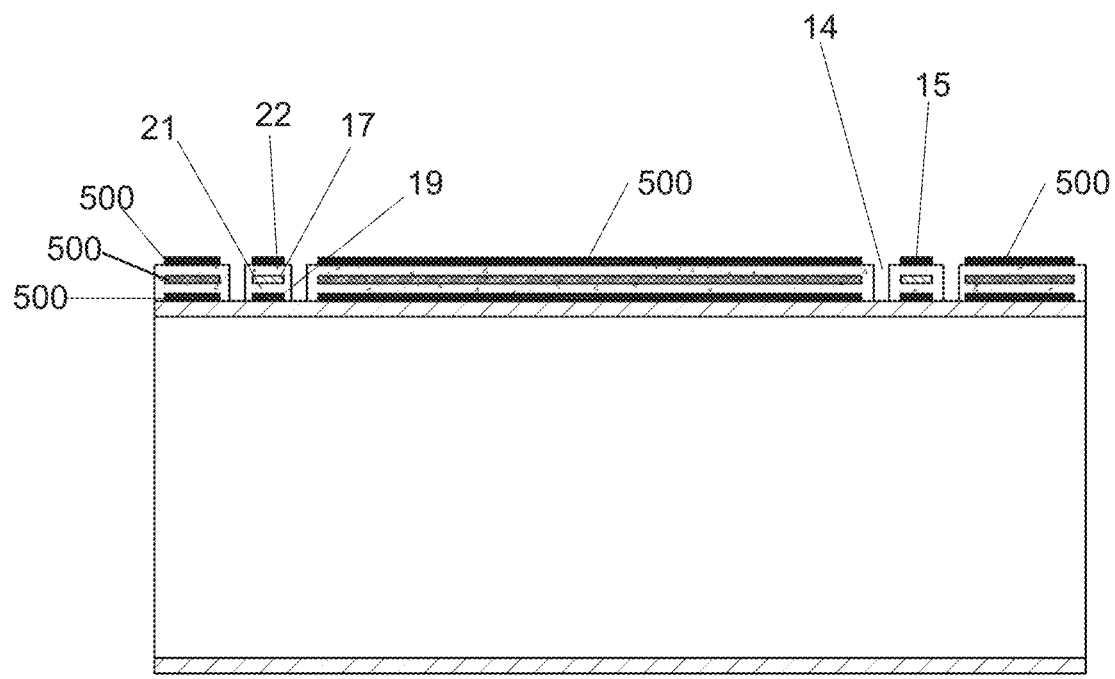
FIG. 11 is a schematic side, cross-section view of an unfinished DSR speaker element made using an electrode layer of FIG. 10.

The electrode layer of FIG. 10 is similar to the electrode layers of FIGS. 1B-1D, but in this embodiment, the electrode layer of FIG. 11 includes non-functional metal portions 500.

Non-functional metal portions 500 may be a result of the manufacturing process used to make the electrode layer. For example, a layer of metal can be disposed on a substrate and then electrodes and conductive lines 13 may be formed or cut out from the metal sheet by etching gaps 41 in the metal sheet. The cutting out of the electrodes and conductive lines would result in non-functional metal portions 500 being disposed on the area of the moving element 10 and the area 11 surrounding flexure benders 12.

FIG. 11 is a schematic side, cross-section view of an unfinished DSR speaker element made using an electrode layer of FIG. 10. The structure of FIG. 11 is substantially the same as the structure of FIGS. 5 and 7, except that the structure of FIG. 11 includes non-functional metal portions 500. The non-functional metal portions 500 are present in the central moving element and in the surrounding area.

Non-functional metal portions 500 will not be connected to any potential and thus float in the piezoelectric material.

Figure 11A:
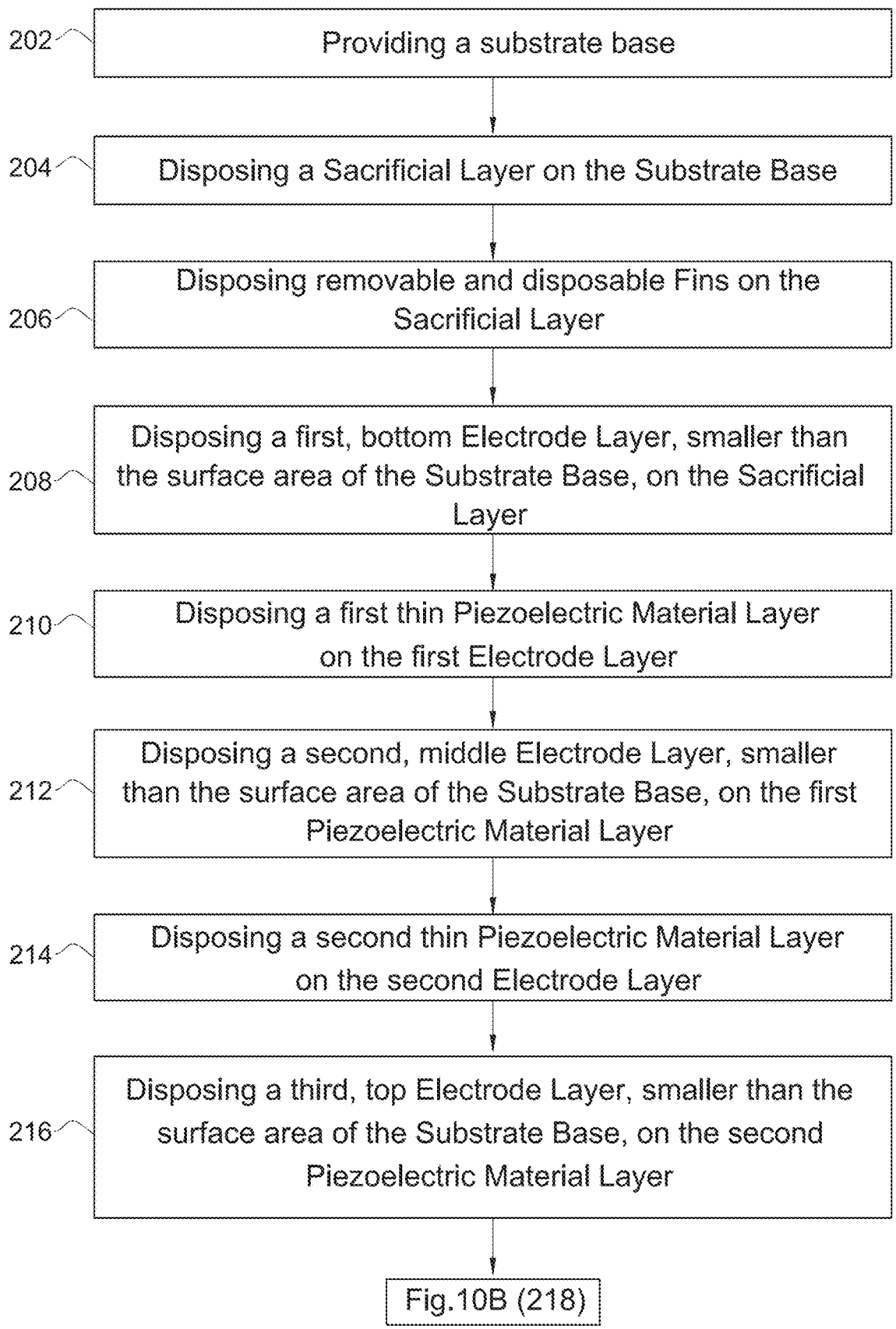
FIGS. 11A and 11B are flow charts of an embodiment of a method of forming and producing a DSR speaker element for a DSR speaker.
Figure 11B:
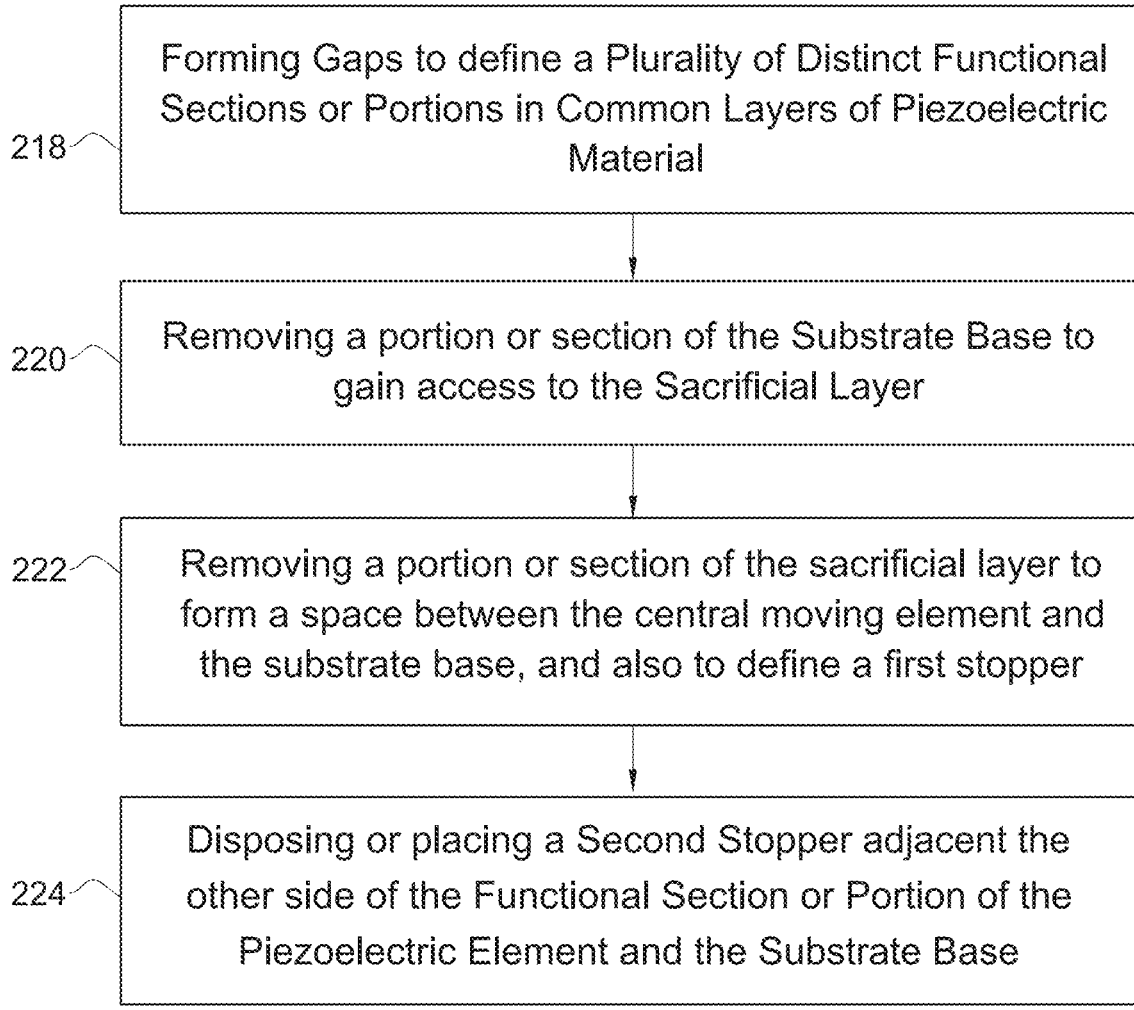

Reference is now made to FIGS. 11A and 11B, which describe a flow chart of an embodiment of a method of forming and producing a DSR speaker element 1 for a DSR speaker. In embodiments of the presently disclosed subject matter, fewer, more and/or different steps than those shown in FIGS. 11A and 11B may be executed.

In embodiments of the presently disclosed subject matter one or more steps illustrated in FIGS. 11A and 11B may be executed in a different order and/or one or more groups of steps may be executed simultaneously. The method is suitable for forming a piezoelectric element that has a plurality of distinct functional sections or portions that are, according to some embodiments, initially formed from a common layer of piezoelectric material, wherein the functional sections or portions are made distinct from one another by forming gaps in the common layer of piezoelectric material. However, the method will be discussed in the context of forming a DSR speaker element, such as DSR speaker element 1 described above.

In addition, in the method of FIG. 11A, three electrode layers and two piezoelectric layers are formed. However, this is not limitative and a different number of electrode layers and piezoelectric layers can be formed, as already mentioned for the various previous embodiments.

In step 202, a substrate base can be provided. With reference to FIG. 3, substrate base 31 is provided from an appropriate material, such as silicon or glass material.

In step 204, a sacrificial layer can be disposed on the substrate base. With reference to FIG. 3, sacrificial layer 32 which is prepared from an appropriate material, such as (but not limited to), silicon dioxide material, can be disposed on substrate base 31.

In step 206, removable and disposable fins can be disposed on the sacrificial layer, the fins defining future gaps in piezoelectric material that will be added later.

According to some embodiments, fins are not disposed and the gaps can be made later using removal techniques.

With reference to FIG. 3, fins 33 can be formed using an appropriate material, such as (but not limited to), poly-silicon material, and can be disposed on sacrificial layer 32 in a pattern that will define gaps 14. According to some embodiments, the fins 33 can be created by disposing a layer of suitable material and defining fins 33 from that layer using lithography and etching processes.

In step 208, a first electrode layer that is smaller than the surface area of the substrate base is disposed on the sacrificial layer. With reference to FIG. 4, electrode layer 19 is formed with the designated purpose of acting in flexure bender 12, and is disposed on sacrificial layer 32. In certain embodiments electrode layer 19 can be formed by depositing photo-resist material on portions of sacrificial layer 32 where gaps in the metal are to be formed and then depositing metal on top of the sacrificial layer 32. In other embodiments electrode layer 19 can be formed by depositing metal on sacrificial layer 32 and then etching gaps in the metal.

In step 210, a first piezoelectric material layer can be disposed on top of the first electrode layer and supported and sustained by the substrate base.

With reference to FIG. 4, a relatively thin piezoelectric layer 21, in the range of 1-25 μm or 1.5-15 μm thick (these values being not limitative), comprising an appropriate piezoelectric material, such as PZT, is disposed on electrode layer 19.

In step 212, a second, middle electrode layer (that is smaller than the surface area of the substrate base) can be disposed on the first piezoelectric material layer. With reference to FIG. 4, electrode layer 17 is disposed on piezoelectric material layer 21. According to some embodiments, gaps 14 and 16 are formed to define the electrodes 17F. At least the gaps 16 can be formed by "etching" or "lift off".

In step 214, a second piezoelectric material layer can be disposed on the middle electrode layer.

According to some embodiments, a portion of the first and second piezoelectric material layer which are disposed on the middle portion of the substrate or of the sacrificial layer will constitute the moving element.

According to some embodiments, and as shown in FIG. 4, a relatively thin piezoelectric layer 22, in the range of 1-25 μm or 1.5-15 μm and comprising an appropriate piezoelectric material, such as PZT, can be disposed on electrode layer 17.

In step 216, a third electrode layer 19 that is smaller than the surface area of the substrate base can be disposed on the second piezoelectric material layer.

With reference to FIG. 5 (and FIG. 6), electrode layer 15, which comprises a flexure bender shaped electrode, since it is formed with the designated purpose of acting in flexure bender 12, is disposed on piezoelectric material layer 22.

According to some embodiments, gaps 14 and 16 are formed to define the electrodes 15F. At least the gaps 16 can be formed by "etching" or "lift off".

According to some embodiments, at least part of the first, second and third electrode layers are formed so as to be in alignment. In particular, the electrodes of the different electrode layers can be in alignment, as shown e.g. in FIG. 1E.

In step 218, gaps can be formed to define a plurality of distinct functional sections or portions in the common layer or layers of piezoelectric material.

With reference to FIG. 1A and FIG. 5 (and FIG. 7), gaps 14 can be formed by removing fins 33 or by etching on each side of a section comprising the first, second and third electrode layers and a portion of the two piezoelectric material layers to define flexure benders 12.

A gap 14 can be formed between a first side of flexure bender 12 and the central layer forming the moving element 10, and a gap 14 can be also formed between another side of flexure bender 12 and surrounding area 11.

According to some embodiments, forming gaps 14 defines flexure benders 12 having at least one piezoelectric material layer 21 or 22 sandwiched between at least two electrode layers 15, 19, and defines a flexure bender 12 section and a moving element 10 section comprising a portion of piezoelectric layer 21 or 22.

In step 220, a portion or section of the substrate base can be removed to gain access to the sacrificial layer, the substrate base formerly supporting a portion of the piezoelectric layers. With reference to FIG. 8, a portion or section of substrate base 31 is removed at a first diameter 80, thereby forming a cavity 800, to gain access to sacrificial layer 32.

In step 222, a portion or section of the sacrificial layer can be removed to form a space between the central moving element and the substrate base. With reference to FIG. 8, a portion or section of sacrificial layer 32 can be removed at a second diameter larger than the first diameter 80 of cavity 800 to form a space 81 between a first side of moving element 10 and substrate base 31 so that substrate base 31 functions as a first stopper 811 to delimit the range of motion of moving element 10.

In step 224 (which is not necessarily performed), a second stopper can be disposed or placed adjacent the other side of the central moving element. With reference to FIG. 8, stopper 82 is disposed or placed adjacent the other side of moving element 10 thereby forming a space 86 between moving element 10 and stopper 82. Second stopper 82 can be anchored to DSR speaker element 1 using an anchor 822. Second stopper 82 delimits the range of motion of moving element 10 when flexure benders 12 are actuated, the actuation done by providing electrical stimulation to piezoelectric layers 21, 22 via electrode layers 15, 17, 19.

Figure 12:
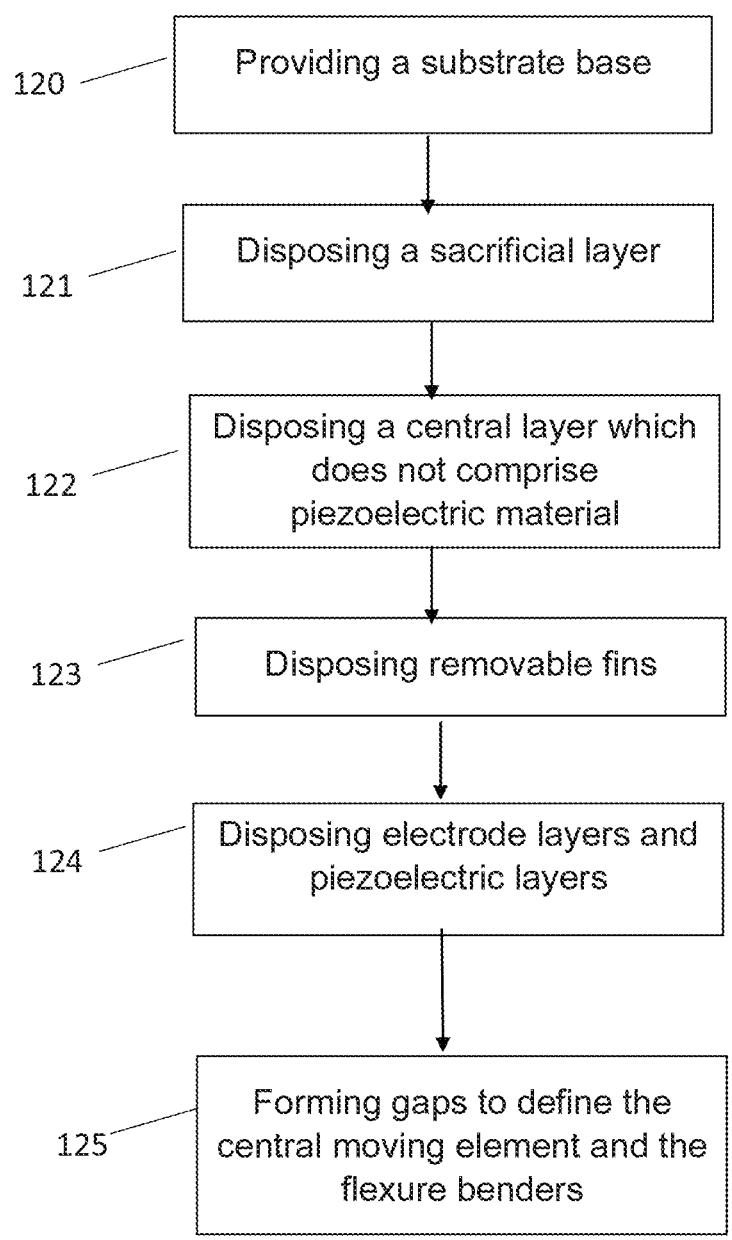
FIG. 12 describes an alternative flow chart of another embodiment of a method of manufacturing a DSR speaker element.

FIG. 12 describes an alternative embodiment of a method of manufacturing a DSR speaker element 1.

The method can comprise a step 120 of providing a substrate base, and a step 121 of forming a sacrificial layer on the substrate base. According to some embodiments, the sacrificial layer is not formed.

The method can further comprise a step 122 of disposing a moving element layer which does not comprise piezoelectric material layer on a middle portion of the sacrificial layer or of the substrate. In FIG. 3A, this can correspond to layer 35.

According to some embodiments, removable fins are disposed on the sacrificial layer or on the substrate (step 143).

The method can then comprise a step 124 of disposing electrode layers and piezoelectric material layers. The number of electrode layers and piezoelectric material layers can be chosen depending on the application.

According to some embodiments, step 124 can comprise disposing a first electrode layer (see e.g. electrode layer 41 in FIG. 4A) on said sacrificial layer, disposing a first piezoelectric material layer (see e.g. first piezoelectric material layer 43 in FIG. 4A) on at least part of said first electrode layer, and disposing a second electrode layer (see e.g. second electrode layer 42 in FIG. 4A) on said first piezoelectric material layer, wherein at least part of the first and the second electrode layers are in alignment. After or as part of the deposition of the first electrode layer (respectively the second electrode layer), gaps (such as gaps 16) can be formed along the perimeter of each electrode layer to define the different peripheral electrodes (such as by etching or lift off).

The method can then comprise a step 125 of forming gaps (such as gaps 14) to define the central moving element (comprising a material different than piezoelectric material) and the flexure benders.

If fins have been disposed, fins can be removed. If the moving element layer comprises the same material as the fins, a mask can be used to avoid removing the moving element layer.

If fins are not present, gaps can be made on each side of the section defining the flexure benders by using removal techniques (such as, but not limited to, removing material using laser cutting, lithography, dry etch processes, or other suitable processes). The section defining the flexure benders can comprise e.g. a portion of the first electrode layer, a portion of the first piezoelectric material layer and a portion of the second electrode layer. If a different number of piezoelectric material layers or electrode layers is used, the section defining the flexure benders will comprise the corresponding number of piezoelectric material layers and electrode layers.

The method can further comprise steps 220 to 224 as described with respect to FIG. 11B, in order to manufacture the DSR speaker element.

Figure 13:
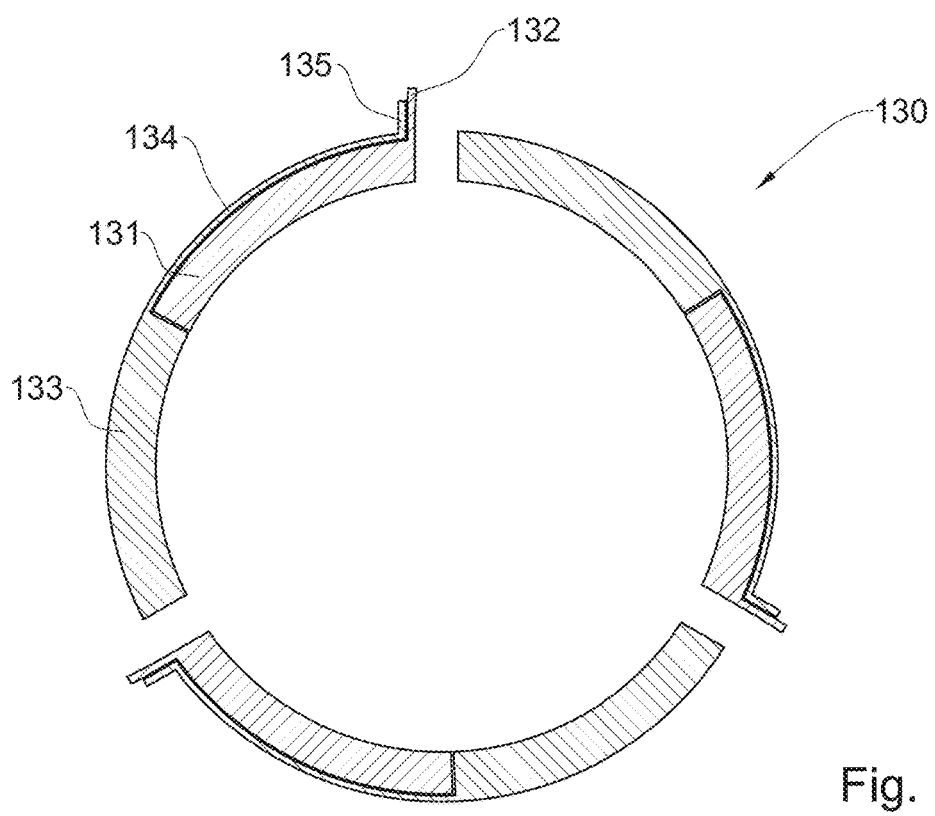
FIG. 13 is a schematic top view of an electrode layer of a DSR speaker element, wherein the electrodes are split into sub-electrodes, and wherein the sub-electrode which is far from the electrical supply point is fed using a thin metal trace.

FIG. 13 is a schematic top view of an electrode layer 130 of a DSR speaker element (such as element 1). The electrode layer 130 can be either e.g. the bottom electrode layer and/or the top electrode layer.

In this embodiment, each electrode of said electrode layer is split into two sub-electrodes (according to some embodiments, each electrode is split into N sub-electrodes, with N>2). In addition, each sub-electrode can be addressed with a different electrical potential.

As shown in FIG. 13, one of the sub-electrodes 133 is closer to the electrical supply than the other sub-electrode 131. A thin metal trace placed next to the closer electrode can be used to provide an electrical supply to the other sub-electrode.

When using a scheme where each of the electrodes is split into at least two sub-electrodes, in some geometries, if different potentials are applied to each of the sub-electrodes, the movements of the moving element 10 may have more translation in a direction normal to the surface of the moving element than when using a single electrode layout and the same potentials.

Electrical supply to the closer sub-electrode 131 can be facilitated directly using connection 132.

According to some embodiments, the split into a plurality of sub-electrodes is used for the top electrode layer and for the bottom electrode layer. In operation, the sub-electrode 131 of the bottom electrode may be connected to an opposite potential to that of the corresponding top electrode and sub-electrode 133 of the bottom electrode may be connected to an opposite potential to that of the corresponding top electrode. According the some embodiments, if a two piezoelectric layers and three electrode layers scheme is used, the middle electrode can be connected to ground potential.

Figure 13A:
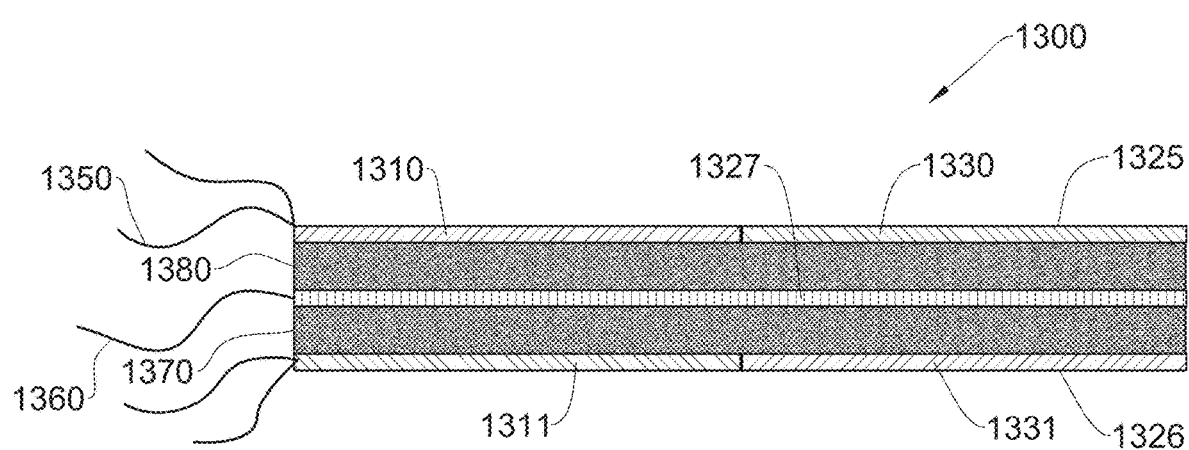
FIG. 13A is a schematic cross section view of a flexure bender which comprises electrodes of FIG. 13.

FIG. 13A is a schematic cross section view of a flexure bender with the electrodes described in FIG. 13.

The top far sub-electrode 1330, or 131 in the top view of FIG. 13, is connected to an electrical supply via conductor 1350 that is connected to the narrow trace 134 (which is not visible in this cross-section).

The closer sub-electrode 1310 is connected directly to the conductor 1350 through connecting section 132 (which is not visible in this cross-section).

In the embodiment depicted in FIG. 13A, there are two piezoelectric material layers 1370 and 1380 and three electrode layers 1325, 1326 and 1327. The top electrode layer 1325 and the bottom electrode layer 1326 comprise electrodes which are split. The middle electrode layer 1327 is connected to the ground and comprises a single electrode which is not split.

According to some embodiments, the top far sub-electrode 1330 is connected to a positive potential, the middle electrode 1360 is connected to ground, the bottom corresponding far sub-electrode 1331 is connected the a negative potential, the top closer sub-electrode 1310 is connected to a negative potential and the bottom corresponding closer half electrode 1311 is connected to a positive potential. Said potential can be reversed to actuate the flexure bender in the opposite direction.

Figure 14:
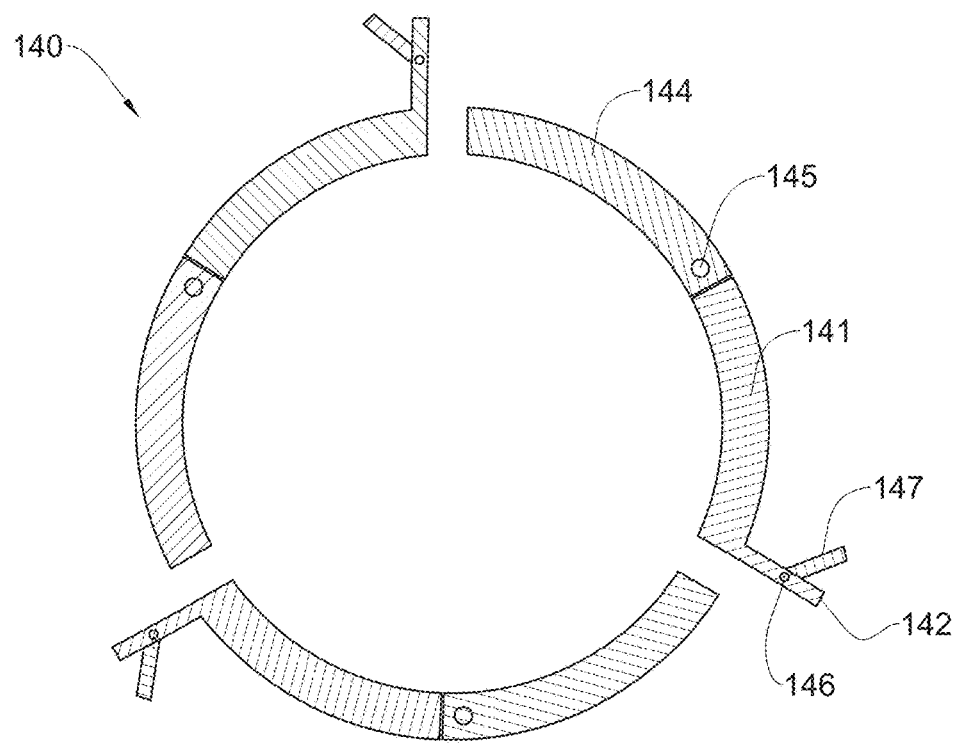
FIG. 14 is a schematic top view of an electrode layer of a DSR speaker element, wherein the electrodes are split into sub-electrodes, and wherein the sub-electrode which is far from the electrical supply point is fed using at least one additional conductive layer.

FIG. 14 is a schematic top view of an embodiment of an electrode layer in which each of the electrodes is split into (at least) two sub-electrodes as in FIG. 13, but where electrical supply to the sub-electrode 144 far from the electrical supply is facilitated using an at least one additional conductive layer.

Since the narrow trace 134 can still affect the bending of the piezoelectric material layer below it, it may be beneficial to bring the electrical potentials to the electrode 144 which is far from the electrical supply by using additional conductive layers with an insulating layer between said conductive layers and the electrodes. Further explanations will be provided with reference to FIG. 14A.

The connection between the additional conductive layer that connects the sub-electrode 144 to its connecting conductor 147 is made through two via hole openings 145 and 146 in the insulating layers. As before, the connection of the closer sub-electrode 141 to the connective conductor 142 can be done directly.

Figure 14A:
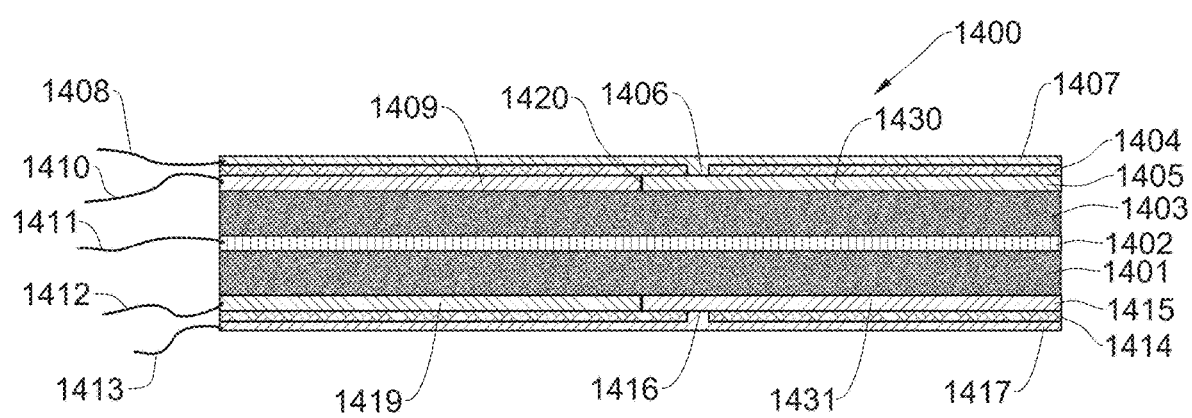
FIG. 14A is a schematic cross section view of a flexure bender which comprises electrodes of FIG. 14.

FIG. 14A is a schematic cross section view of an embodiment of a flexure bender 1400 which comprises a layout in compliance with the electrode layout of FIG. 14. It is to be noted that a different number of electrode layers and/or piezoelectric material layers and/or sub and top conductive layers can be used, depending on the design.

In this example, the flexure bender 1400 comprises two piezoelectric material layers 1401 and 1403, a top electrode 1430, a bottom electrode 1431, both split into two sub-electrodes, and a middle electrode 1402 which is not split into different sub-electrodes.

The top electrode 1430 is split into a sub-electrode 1405 (identical to electrode 144 of FIG. 14) and a sub-electrode 1409 (which is closer to the electrical supply and identical to electrode 141 of FIG. 14).

The sub-electrode 1409 is connected directly to a conductor (equivalent to the conductor 142 of FIG. 14, but which is not shown in FIG. 14A), and from this conductor to an outside conductor 1410.

The electrical supply to the sub-electrode 1405 can be made through a top conductive layer 1407. This conductive layer 1407 can be electrically insulated by insulating layer 1404 (placed below the conductive layer 1407) from the sub-electrode 1409 and connected only to the sub-electrode 1405 through a via hole 1406 in the insulating layer 1404. The conductive layer 1407 can be electrically connected via another via hole 146 to a conductor 147, both not shown in this cross section but visible in FIG. 14.

As shown in FIG. 14, the bottom electrode structure is symmetrical to the top electrode structure. As already mentioned for the top electrode 1430, the bottom electrode 1431 is split into a sub-electrode 1415 and a sub-electrode 1419.

The sub-electrode 1415 is connected through via hole 1416 to the bottom conductive layer 1417, wherein the via hole 1416 goes through the insulating layer 1414, and from it to the outside conductor 1413 through another via hole and another conductor, similar to via hole 146 and conductor 147 of the top electrode layer.

In the embodiments of FIGS. 13, 13A, 14 and 14A, if a single piezoelectric material layer is used, it is possible to use only the top electrode and the bottom electrode without the middle electrode. In this case, according to some embodiments, opposite polarities can be used.

In a non-limitative example, the middle, non-split electrode 1402 is connected to ground potential, the top sub-electrode 1405 can be connected to a voltage of value +10V, the bottom sub-electrode 1415 can be connected to a voltage of value −10V, the top sub-electrode 1409 (which is closer to the electrical supply) can be connected to a voltage of value −10V and the bottom sub-electrode 1419 (which is closer to the electrical supply) can be connected to a voltage of value +10V.

According to other embodiments, in which a single piezoelectric layer and two electrode layers are used, both bottom and top electrodes can be split into at least two sub-electrodes.

In this case, the two sub-electrodes can be connected to opposite potentials.

According to other embodiments, in which a single piezoelectric layer and two electrode layers are used, one of the electrodes, for example, the bottom electrode can be split into two sub-electrodes while the other electrode remains a whole electrode.

In this case, the two sub-electrodes can be connected to opposite potentials while the whole electrode can be connected to the ground.

Other configurations can be used (number of sub-electrodes, number of electrode layers and piezoelectric layers, etc.).

Figure 15:
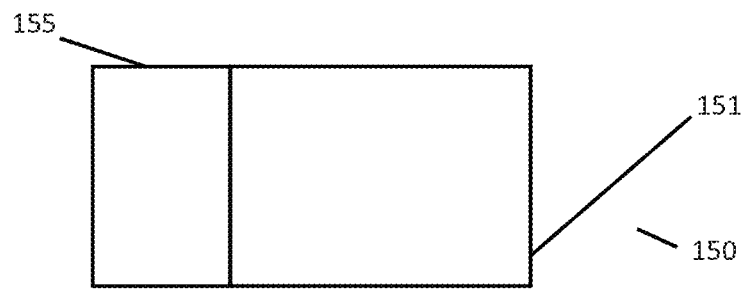
FIG. 15 is a schematic top view of a piezo-electric actuator, comprising a moving assembly.

Attention is drawn to FIG. 15, which is a schematic top view of an embodiment of a piezo-electric actuator 150.

As shown, the piezo-electric actuator 150 can comprise an assembly 151.

The assembly 151 can be attached or anchored to a base or body 155. For example, one side of the assembly 151 can be attached or anchored to the body 155.

At least part of the assembly 151 can be in particular configured to move in response to the application of an electrical stimulus. At least part of the assembly 151 can have a relative motion with respect to the body 155.

According to some embodiments, at least part of the assembly 151 can move either upwards or downwards along an axis perpendicular to a surface of the assembly 151, or along an axis perpendicular to the body 155. In particular, the assembly 151 can bend upwards or downwards.

The cross-section (along a plane parallel to the body 155, or perpendicular to the motion of the assembly) of the assembly 151 can have at least one straight side. For example, the cross-section can have a shape which is e.g. a square, a rectangle, etc. This is however not limitative.

According to some embodiments, the assembly 151 has at least one side which is not secured to the body 155.

According to some embodiments, the assembly 151 has at least three sides which are not secured to the body 155.

Figure 15A:
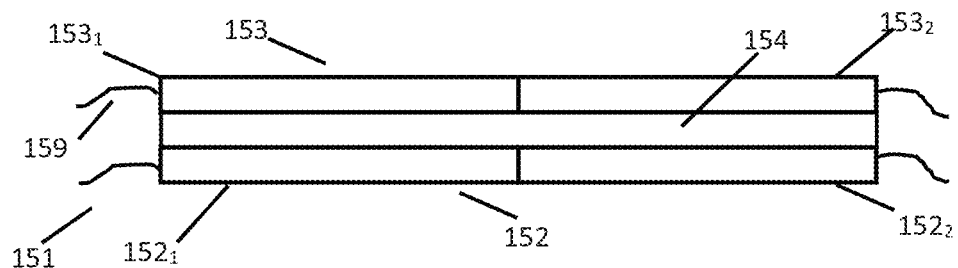
FIG. 15A is a schematic cross section view of an assembly that can be used in the piezo-electric actuator of FIG. 15.
Figure 15B:
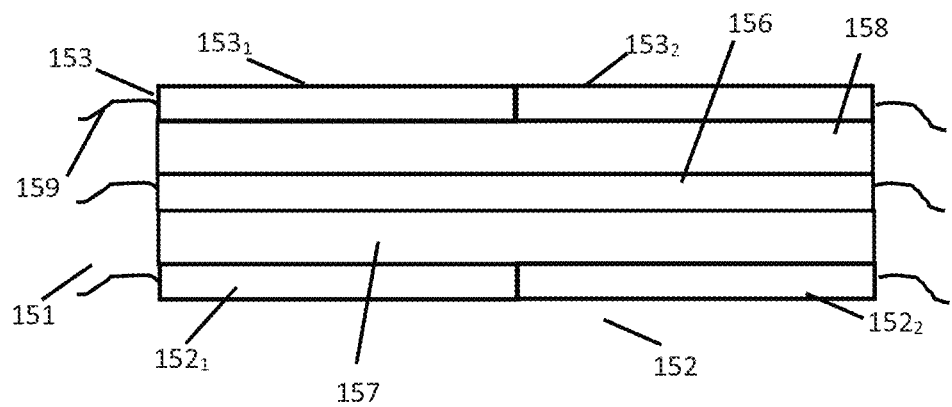
FIG. 15B is a schematic cross section view of another assembly that can be used in the piezo-electric actuator of FIG. 15.

As shown in FIG. 15A, the assembly 151 can comprise a first electrode 152, a second electrode 153, and at least one piezoelectric layer 154 located between said first electrode 151 and said second electrode 153.

Assembly 151 can comprise also a substrate (not represented). According to some embodiments, the substrate can be common to the assembly 151 and to the body 155.

Assembly 151 can be manufactured e.g. by depositing the required layers and forming one or more gaps between the assembly 151 and the body 155.

According to some embodiments, at least one of the first electrode 152 and the second electrode 153 is split into at least two distinct sub-electrodes. In the example of FIG. 15A, the first electrode 152 is divided into sub-electrodes $152_1$, $152_2$ and the second electrode 153 is also divided into sub-electrodes $153_1$, $153_2$.

The first electrode 152 and the second electrode 153 can be connected to an electrical supply, using a plurality of conductive elements 159 connected to the electrodes. Upon application of an electrical stimulus, the piezoelectric layer 154 can bend and the assembly 151 can move upwards or downwards.

According to some embodiments, when a sub-electrode $152_1$ of the first electrode is connected to a positive potential, and another sub-electrode $152_2$ of the first electrode is connected to a negative potential, corresponding sub-electrodes $152_1$, $152_3$ of the second electrode are connected to opposite potentials with respect to the sub-electrodes $152_1$, $152_2$ of the first electrode. In some embodiments, the sub-electrode $152_1$ is connected to a negative potential and the other sub-electrode $152_2$ is connected to a positive potential, and the sub-electrodes of the second electrode 153 are connected to opposite potentials.

According to some embodiments, the first electrode 152 and/or the second electrode 153 can be electrically fed as described with respect to FIG. 13 and FIG. 13A. As described in these embodiments, electrical supply to the sub-electrode closer to the electrical supply than the other sub-electrode is facilitated using an at least one thin metal trace placed next to the closer electrode. Since these embodiments were already described, they are not described again.

According to some embodiments, the first electrode 152 and/or the second electrode 153 can be electrically fed as described with respect to FIG. 14 and FIG. 14A. As described in these embodiments, electrical supply to the sub-electrode far from the electrical supply is facilitated using an at least one additional conductive layer. Since these embodiments were already described, they are not described again.

According to some embodiments, the first electrode is connected to a first conductive element, the second electrode is connected to a second conductive element, and the first conductive element is not in alignment with the second conductive element.

According to some embodiments, assembly 151 can comprise at least three electrodes, and can be in compliance with any of the embodiments described with reference to FIGS. 13, 13A, 14 and 14A (these embodiments were described for the flexure bender, but apply similarly to the assembly 151).

Figure 16:
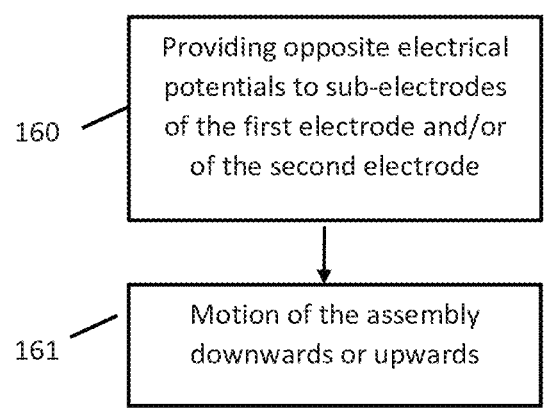
FIG. 16 represents operation that can be performed to control the piezo-electric actuator.

In particular, as illustrated in FIG. 16, the assembly 151 can comprise:
a first electrode 152, as described in FIG. 15A;
a first piezoelectric layer 157;
a middle electrode 156;
a second piezoelectric layer 158; and
a second electrode 153, as described in FIG. 15A.

This structure is similar to the structure described with reference to FIGS. 13, 13A, 14 and 14A.

As mentioned above, according to some embodiments, at least one of the first electrode and the second electrode can be split into two sub-electrodes.

According to some embodiments, the middle electrode 156 is not split.

According to some embodiments, the first electrode 152 and/or the second electrode 153 can be electrically fed as described with respect to FIG. 13 and FIG. 13A. As described in these embodiments, electrical supply to the sub-electrode closer to the electrical supply than the other sub-electrode is facilitated using an at least one thin metal trace placed next to the closer electrode. Since these embodiments were already described, they are not described again.

According to some embodiments, the first electrode 152 and/or the second electrode 153 can be electrically fed as described with respect to FIG. 14 and FIG. 14A. As described in these embodiments, electrical supply to the sub-electrode far from the electrical supply is facilitated using an at least one additional conductive layer. Since these embodiments were already described, they are not described again.

According to some embodiments, an array comprising a plurality of piezo-electric actuators can be built, which can be interconnected using e.g. conductive elements 159.

As shown in FIG. 16, an electrical stimulus (voltage) can be provided to at least one of the first and second electrodes (operation 160). In particular, if the first electrode 152 comprises two sub-electrodes, opposite electrical potentials can be applied to the sub-electrodes of the first electrode. Similarly, if the second electrode 153 comprises two sub-electrodes, opposite electrical potentials can be applied to the sub-electrodes of the second electrode. In some embodiments, and as mentioned above, if a sub-electrode of the first electrode receives an electrical potential, an opposite sub-electrode of the second electrode receives an opposite electrical potential.

The middle electrode 156 can be e.g. connected to the ground. In response to the electrical stimulus, the assembly can move downwards or upwards (operation 161).

The present invention has been described with a certain degree of particularity, but those versed in the art will readily appreciate that various alterations and modifications may be carried out.

It is to be noted that the various features described in the various embodiments may be combined according to all possible technical combinations.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the concept upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

The invention claimed is:

1. A piezo-electric actuator comprising:
an assembly comprising:
a first electrode,
a second electrode, and
at least one piezoelectric layer located between said first electrode and said second electrode,
wherein at least one of the first electrode and the second electrode is split into at least two different electrically mutually isolated sub-electrodes, called respectively a first sub-electrode and a second sub-electrode, and
wherein at least part of the assembly is configured to move upwards or downwards, in response to an electrical stimulus applied to at least one of said first and second electrodes,
wherein, each of the two sub-electrodes is connected to an electrical supply, wherein the piezo-electric actuator comprises a conductive layer connecting the electrical supply to the second sub-electrode,
wherein the conductive layer is insulated from the first sub-electrode by an insulating layer, and
wherein the conductive layer is electrically connected to the second sub-electrode through a via hole present in the insulating layer.

2. The piezo-electric actuator of claim 1, wherein each of the first electrode and the second electrode is split into at least two different sub-electrodes.

3. The piezo-electric actuator of claim 1, wherein a cross-section of the assembly has at least one straight side.

4. The piezo-electric actuator of claim 1, further comprising a base, said assembly being secured to said base along at least part of one side of said assembly.

5. The piezo-electric actuator of claim 2, wherein when the first sub-electrode of the first electrode is connected to a positive potential, and the second sub-electrode of the first electrode is connected to a negative potential, corresponding opposite first and second sub-electrodes of the second electrode are connected to opposite potentials with respect to the first and second sub-electrodes of the first electrode.

6. The piezo-electric actuator of claim 1, wherein:
the first electrode is connected to a first conductive element,
the second electrode is connected to a second conductive element,
wherein the first conductive element is not in alignment with the second conductive element.

7. The piezo-electric actuator of claim 1, comprising:
a third electrode layer,
a first piezoelectric layer located between said first electrode and said third electrode, and
a second piezoelectric layer located between said third electrode and said second electrode.

8. The piezo-electric actuator of claim 1, wherein said first and second electrodes include conductive elements for at least one of:
the connection between different electrodes,
the connection with another piezo-electric actuator, and
the connection with an external electrical supply.

9. An array of piezo-electric actuators comprising a plurality of piezo-electric actuators according to claim 1.

* * * * *